United States Patent
Watanabe

(10) Patent No.: US 7,151,299 B2
(45) Date of Patent: Dec. 19, 2006

(54) SEMICONDUCTOR DEVICE AND ITS MANUFACTURING METHOD

(75) Inventor: Heiji Watanabe, Tokyo (JP)

(73) Assignee: NEC Corporation, Tokyo (JP)

(*) Notice: Subject to any disclaimer, the term of this patent is extended or adjusted under 35 U.S.C. 154(b) by 242 days.

(21) Appl. No.: 10/511,423

(22) PCT Filed: Apr. 14, 2003

(86) PCT No.: PCT/JP03/04700

§ 371 (c)(1),
(2), (4) Date: Oct. 15, 2004

(87) PCT Pub. No.: WO03/088357

PCT Pub. Date: Oct. 23, 2003

(65) Prior Publication Data

US 2005/0167761 A1  Aug. 4, 2005

(30) Foreign Application Priority Data

Apr. 15, 2002  (JP) ............................ 2002-112182

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/369; 257/371; 257/E21.193; 257/E21.165; 257/E21.635; 438/275

(58) Field of Classification Search ................ 438/275; 257/369, 371

See application file for complete search history.

(56) References Cited

U.S. PATENT DOCUMENTS 5,596,214 A   1/1997  Endo (Continued)

FOREIGN PATENT DOCUMENTS

JP           3-30470           2/1991

(Continued)

*Primary Examiner*—Fernando L. Toledo
(74) *Attorney, Agent, or Firm*—McGinn IP Law Group, PLLC

(57) ABSTRACT

The present invention provides a semiconductor device structure and an easy-to-use method for manufacturing thereof enabling to suppress wafer contamination and to form the semiconductor device superior in control and uniformity of the film thickness in the semiconductor device including plural kinds of transistors provided with a gate insulator film with different film thickness.

According to the method, plural kinds of transistors with gate insulator films having different electric film thickness are formed in the steps of
forming an insulating film layer including a lamination structure of at least first insulating film 104 constituted of first high-dielectric insulating material and second insulating film 103 constituted of second high-dielectric insulating material on the same silicon substrate 101,
selectively etching and removing the upper insulating film 103 on the part of region 105 by use of mask 107 and utilizing multi-oxide process while reducing leak electric current.

65 Claims, 14 Drawing Sheets

U.S. PATENT DOCUMENTS

| | | | |
|---|---|---|---|
| 5,960,289 A * | 9/1999 | Tsui et al. | 438/275 |
| 6,143,669 A * | 11/2000 | Cho | 438/770 |
| 6,169,018 B1 * | 1/2001 | Lee | 438/587 |
| 6,184,072 B1 * | 2/2001 | Kaushik et al. | 438/197 |
| 6,255,698 B1 * | 7/2001 | Gardner et al. | 257/369 |
| 6,278,164 B1 | 8/2001 | Hieda et al. | |
| 6,528,858 B1 * | 3/2003 | Yu et al. | 257/493 |

FOREIGN PATENT DOCUMENTS

| | | |
|---|---|---|
| JP | 7-326681 | 12/1995 |
| JP | 11-67760 | 3/1999 |
| JP | 2000-232170 | 8/2000 |
| JP | 2000-307010 | 11/2000 |
| JP | 2000-307083 | 11/2000 |

* cited by examiner

SEMICONDUCTOR DEVICE AND ITS MANUFACTURING METHOD

TECHNICAL FIELD

The present invention relates to a semiconductor device having a gate insulator film constituted of high-dielectric insulating material and a manufacturing method for the same and more particularly relates to a semiconductor device formed on the same substrate and constituted of plural kinds of transistors having plural kinds of gate insulator films and a manufacturing method therefore.

BACKGROUND OF THE ART

In a semiconductor device using MOSFET (metal-oxide semiconductor field-effect transistor), accompanied with high performance and integration, thinning of the gate insulator film constituting the MOSFET has been advanced. For instance, to improve electric current driving capability in a MOSFET of gate length of 100 nm or less, film thickness thereof is required to be 1.5 nm or less in accordance with a scaling law when a silicon oxidation film is used as the gate insulator film. On the other hand, when such a ultra-thin silicon oxidation film is used as the gate insulator film, tunnel electric current generated with sandwiching the gate insulator film in applying a gate bias can not be ignored to source/drain electric current. To suppress such increase of the tunnel electric current has been a major issue in achieving high performance and low electric power consumption in the MOSFET.

In addition, in these years, development of extra-low-power-consumption device has been required with a focus on mobile use. In these semiconductor devices for mobile use, individual element itself is designed in a device scale in which the film thickness of the gate insulator film can be formed larger compared with the semiconductor device for high performance and integration. In order to achieve extra-low power consumption as a whole, however, it is required to drastically reduce unnecessary leak electric current such as the tunnel electric current in application of the gate bias compared with conventional devices using silicon oxidation film as the gate insulator film.

Thus, some techniques have been developed for thinning in effective (electrical) film thickness of the gate insulator film and simultaneously suppressing the tunnel electric current within allowable values on the device design both of a high-performance element and a low-power-consumption element.

One of the techniques is a method constituted of; adding nitrogen into a silicon oxidation film to form the gate insulator film having an increased dielectric constant compared with a pure silicon oxidation film, and thereby reducing effective film thickness of the gate insulator film without physically thinning the film thickness. Further in recent years, there has been carried out, instead of the silicon oxidation film, an approach to use as insulating material for the gate insulator film, insulative metal oxide thin film with the dielectric constant of 10 or more or an insulative silicate thin film formed with composite material of these insulative metal oxide material and silicon. Rare-earth element oxide such as $Al_2O_3$, $ZrO_2$, $HfO_2$, and $Y_2O_3$, lanthanoid rare-earth element oxide such as $La_2O_3$, or silicate thin film thereof are under consideration.

In addition, in case of using insulating material with the high-dielectric constant as the gate insulator film, improvement of electric properties of boundary face, namely, interface between the gate insulator film and a silicon substrate is a significant development subject.

As a solution, there is proposed layer structure constituted of an insulating film of insulating material with high dielectric constant (defined herein as a high-dielectric insulating material film), an interface oxide film and the silicon substrate by inserting an interface layer based the silicon oxidation film between the high-dielectric insulating material film and the silicon substrate. Following methods are listed as a method of forming the layer structure provided with this interface oxide film, for instance, a method of previously forming an oxide film layer on a silicon substrate surface as a base oxide film prior to film forming of the high-dielectric insulating material film, or a method of directly forming the high-dielectric insulating material film on the silicon substrate surface, thereafter subjecting the silicon substrate to heat treatment, and thereby growing a thermally-oxidized film layer on an interface.

While, as mentioned above, regarding the gate insulator film constituting individual element, various properties are required depending on the use and further when constituting an integrated circuit using a plurality of elements a technique is required to form on the same substrate, for instance, many kinds of purposive transistors different from each other in the respective element constitutions.

Specifically, there are cases of forming on the same substrate a transistor for high speed operation and a transistor of low-power-consumption type and of forming a transistor constituting an internal circuit and a transistor of input/output portion. In these cases, different kinds of transistors are desirably designed for different element structures in which thickness of the gate insulator film is appropriately selected depending on respective uses. Further regarding a tunnel insulating film used in a flash memory etc. an insulating film different from the gate insulator film of normal MOSFET is used, thereby optimization thereof is required to be performed.

When preparing an integrated circuit using a plurality of different kinds of elements, a technique is required to form on the same substrate plural kinds of insulating films different in effective (electric) film thickness depending on each kind of element. This preparing technique is called multi-oxide process. Now, development of the technique is pressing need, and some of the techniques have been proposed before.

A first technique of the multi-oxide process already proposed is a process of preparing a plural kind of insulating films different in film thickness by sequentially repeating the following steps of; patterning a silicon oxidation film formed on a silicon substrate surface through a resist mask and hydrofluoric acid solution treatment, providing an opening of partially stripped off silicon oxidation film, thereafter forming desired insulating film (silicon oxidation film) at the opening portion.

A second technique of the multi-oxide process already proposed is a process of forming plural kinds of insulating films different in the film thickness by performing ion implantation into a specific portion of a silicon substrate surface, and changing (speeding up) oxidation rate in the ion implantation region compared with the other region. These processes are now under discussion.

In the techniques of the multi-oxide process already proposed above, debate is proceeding with a central focus on a technique of selectively changing film thickness of the silicon oxidation film itself. However, following problems exist in the process. For instance, in the technique of sequentially repeating steps of partially exfoliating of the silicon oxidation film through the resist mask and selective wet-etching and thereafter forming the silicon oxidation film again at the opening, entire steps become complicated as the kinds of the prepared silicon oxidation film different in the film thickness increase, and further exposure on a wafer surface after exfoliating of the silicon oxidation film becomes a problem.

A cleaning step of removing the contamination on the wafer surface in the silicon oxidation film exfoliating portion (device region) comprises the steps of exfoliating the resist mask with chemical, and thereafter cleaning an entire wafer surface with mixture of ammonia and hydrogen peroxide solution and mixture of sulfuric acid and hydrogen peroxide solution, and then there is formed a thin oxide film (chemical oxide film) on the silicon surface. The oxide film remaining after this cleaning step has variation in film thickness and is inferior in insulation properties and crude in film quality. Therefore, when forming a thinner gate oxide film, the step of forming the gate oxide film is performed after previously exfoliating with the hydrofluoric acid solution.

However, this step of exfoliating chemical oxide film (etching removal) is carried out after removing the resist mask covering a thick silicon oxidation film surface, and therefore a problem that loss in film thickness is slightly caused in the thick silicon oxidation film region arises.

In order to deal with the loss nitriding treatment or cladding different kind of insulating film is performed on the thick silicon oxidation film surface that reduces etching rate than that of the chemical oxide film formed in the cleaning step of the above exposure removal. A process utilizing the difference in etching rate is proposed to suppress the loss on the thick silicon oxidation film surface which is caused through exfoliating of the chemical oxide film.

The detail of the process is, for instance, disclosed in Japanese laid open patent number 2001-196464.

On the other hand a step of recovering damages arising from ion irradiation is indispensable for controlling oxidization rate. For instance in case of adding a step accompanied by heat treatment, undesired affection may arise to other steps. Further it is pointed out from a practical standpoint that there exists constraint in the aspect of productivity and cost accompanied by the step of the selective ion irradiation.

As described above, in order to realize optimization of individual element performance, specifically high performance and low electric power consumption it is necessary to use high-dielectric insulating material film and to employ a multi-oxide process corresponding to it, instead of silicon oxide.

In case of utilizing high-dielectric insulating material film it is already proposed as element constitution that insulating films different from each other are employed between a high speed operation element and an element with the type of low electric power consumption or between an element constituting internal circuit and an element at input/output portion. Specifically, combination of silicon oxidation film or silicon oxynitride film and metallic oxidation film with high-dielectric insulation can be thought as the element constitution. As for the corresponding multi-oxide process, the step of the above high-dielectric insulating material film is focused on a deposition technique onto silicon substrate surface.

Accordingly, it is difficult in general to apply the technique utilized in controlling oxidation rate of silicon substrate by ion implantation.

Therefore, when utilizing the deposition technique onto silicon substrate surface in the step of forming the high-dielectric insulating material film, a method can be thought as a basic example of the corresponding multi-oxide process, in which partially forming an opening portion by the use of mask such as resist, in addition, oxidization or oxidizing and nitriding of the opening region, and depositing high-dielectric insulating material film are sequentially repeated.

Then, as in the case of the multi-oxide process utilizing silicon oxidation films it is supposed that there arise deterioration of uniformity in film thickness and contamination of silicon substrate surface exposed on the opening portion, etc. accompanied by forming the opening. Particularly in case of utilizing metal oxide films with high-dielectric insulation, it is concerned that adhesion of metal element to silicon substrate surface arising from the removal (etching) step becomes a new factor of contamination, because the silicon substrate surface is exposed to the opening portion.

Accordingly, it is desired to propose a new element constitution in semiconductor device and a new process suitable for a multi-oxide process corresponding to a multi-oxide structure which enables to avoid new factors of contamination supposed to arise in utilizing those high-dielectric insulating material films, and which utilizes high-dielectric insulating material films formed by the use of deposition techniques.

DISCLOSURE OF THE INVENTION

The present invention is to solve the above issues.

An object of the present invention is to provide semiconductor device structure which can suppress wafer contamination in multi-oxide process and is superior in controllability and uniformity of film thickness or productivity, in addition to improvement of operation characteristics in an element such as lowering of electric power consumption and increasing of reliability in a semiconductor device including plural kinds of transistors having gate insulator films with different film thickness.

Further, another object of the present invention is to provide a manufacturing method of a semiconductor device which can suppress wafer contamination in multi-oxide process and is superior in controllability and uniformity of film thickness or productivity, in addition to improvement of operating characteristics in an element such as lowering of electric power consumption and increasing of reliability in a semiconductor device including plural kinds of transistors having gate insulator films with different film thickness.

To solve the above issues we, inventors of the invention, have researched with all our hearts.

In the research, inventors have found out that, in case that at least two transistors in a semiconductor device using plural kinds of transistors are formed on the same silicon substrate and formed so as to have a gate insulator film with different electric film thickness each other, and the one transistor including a first insulating film constituted of first high-dielectric insulating material in the gate insulator film and the other transistor having lamination structure including a second insulating film constituted of second high-dielectric insulating material in addition to the first insulating film constituted of the first high-dielectric insulating material in the gate insulator film, both gate insulator films can be constituted so as to be different from each other in the electric film thickness. Further, the inventors have confirmed that by employment of such element constitution, subsequent process can be performed without exposing the silicon substrate surface beneath the gate insulator film after forming the first insulating film constituted of the first high-dielectric insulating material, thereby effecting suppression of wafer contamination in multi-oxide process. Based on the above knowledge, the inventors have accomplished the present invention.

A semiconductor device provided by first aspect of the present invention is;
a semiconductor device including plural kinds of transistors, the plural kinds of transistors including at least:
a first transistor provided with a first gate insulator film which includes a first insulating film constituted of first high-dielectric insulating material and has first electric film thickness and
a second transistor provided with a second gate insulator film which includes layer structure including the first insulating film and a second insulating film constituted of second high-dielectric insulating material different from the first high-dielectric insulating material and has second electric film thickness different from the first electric film thickness,
the first and the second transistors being formed on the same silicon substrate.

In the above case, the semiconductor device can be constituted such that the first and the second high-dielectric insulating material include elements with different constitution each other.

In the above case, the semiconductor device can be constituted such that the first and the second high-dielectric insulating material include elements with the same constitution and different ratio of composition each other.

In the above case, the semiconductor device can be constituted such that the first and the second high-dielectric insulating material have different crystal structure each other.

In the above case, the semiconductor device can be constituted such that at least one of the first and the second insulating films continuously changes in the direction of film thickness in at least any one of kinds of constitutive element and ratio of composition.

In the above case, the semiconductor device can be constituted such that the first and the second high-dielectric insulating material have different density each other.

In the above case, the semiconductor device can be constituted such that the first and the second insulating films have different profiles each other with respect to density of dangling bond in the films in the direction of the film thickness.

In the above case, the semiconductor device can be constituted such that an interface layer constituted of at least any one of a silicon oxidation film, a silicon oxynitride film or a silicon nitriding film exists on interface between the first insulating film or the second insulating film, and relevant silicon substrate in at least one of the first and the second gate insulator films.

In the above case, the semiconductor device can be constituted such that the first and the second high-dielectric insulating material included in the second gate insulator film are different from each other in etching rate for wet-etching, and an insulating film constituted of insulating material with relatively high etching rate is extending on an insulating film constituted of insulating material with relatively low etching rate. In this case, for instance, the etching rate is the etching rate for hydrofluoric acid solution.

In the above case, the semiconductor device can be constituted such that the first and the second high-dielectric insulating material included in the second gate insulator film are different from each other in etching rate for vapor phase etching, and an insulating film constituted of insulating material with relatively high etching rate is extending on an insulating film constituted of insulating material with relatively low etching rate. In this case, for instance, the etching rate is the etching rate for vapor phase etching by fluorine radical.

In the above case, the semiconductor device can be constituted such that the layer structure including the first insulating film and the second insulating film comprises a layer modulated in composition in the direction of film thickness, underneath region of the layer being formed with a first insulating film constituted of the first high-dielectric insulating material and upper region of the layer being formed with a second insulating film constituted of the second high-dielectric insulating material.

A semiconductor device provided by second aspect of the present invention is;
a semiconductor device constituted of at least;
first insulating film structure which includes a first insulating film constituted of first high-dielectric insulating material and has first electric film thickness and
second insulating film structure which includes layer structure including the first insulating film and a second insulating film constituted of second high-dielectric insulating material different from the first high-dielectric insulating material and has second electric film thickness different from the first electric film thickness,
the first and the second insulating film structure being formed on the same semiconductor substrate.

In the above case, the semiconductor device can be constituted such that the first and the second high-dielectric insulating material include elements with different constitution each other.

In the above case, the semiconductor device can be constituted such that the first and the second high-dielectric insulating material include elements with the same constitution and different ratio of composition each other.

In the above case, the semiconductor device can be constituted such that the first and the second high-dielectric insulating material have different crystal structure each other.

In the above case, the semiconductor device can be constituted such that at least one of the first and the second insulating films continuously changes in the direction of the film thickness in at least any one of kinds of constitutive element and ratio of composition.

In the above case, the semiconductor device can be constituted such that the first and the second high-dielectric insulating material have different density each other.

In the above case, the semiconductor device can be constituted such that the first and the second insulating films have different profiles each other with respect to density of dangling bond in the films in the direction of film thickness.

In the above case, the semiconductor device can be constituted such that the semiconductor substrate is constituted of silicon substrate, and an interface layer constituted of at least any one of a silicon oxidation film, a silicon oxynitride film or a silicon nitriding film exists on interface between the first insulating film or the second insulating film, and relevant silicon substrate in at least one of the first and the second gate insulator films.

In the above case, the semiconductor device can be constituted such that the first and the second high-dielectric insulating material included in the second insulating film structure are different from each other in etching rate for wet-etching, and an insulating film constituted of insulating material with relatively high etching rate is extending on an insulating film constituted of insulating material with relatively low etching rate. In this case, for instance, the etching rate may be the etching rate for hydrofluoric acid solution.

In the above case, the semiconductor device can be constituted such that the first and the second high-dielectric insulating material included in the second insulating film structure are different from each other in etching rate for vapor phase etching, and an insulating film constituted of insulating material with relatively high etching rate is extending on an insulating film constituted of insulating material with relatively low etching rate.

In the above case, the semiconductor device can be constituted such that the etching rate is the etching rate for vapor phase etching by fluorine radical.

In the above case, the semiconductor device can be constituted such that the first and the second insulating film structure are included in different kinds of first and second semiconductor elements which are formed on the same semiconductor substrate and contact with the semiconductor substrate surface.

In the above case, the semiconductor device can be constituted such that the first and the second semiconductor elements are of the type of field effect transistor, and the first and the second insulating film structure are provided for electrically separating an electrode for controlling electric field from the semiconductor substrate surface.

In the above case, the semiconductor device can be constituted such that the layer structure including the first insulating film and the second insulating film comprises a layer modulated in composition in the direction of film thickness, underneath region of the layer being formed with a first insulating film constituted of the first high-dielectric insulating material and upper region of the layer being formed with a second insulating film constituted of the second high-dielectric insulating material.

A semiconductor device provided by third aspect of the present invention is;
a semiconductor device including plural kinds of semiconductor elements, the plural kinds of semiconductor elements including at least:
a first semiconductor element provided with first insulating film structure which includes a first insulating film constituted of first high-dielectric insulating material with first etching rate and has first electric film thickness and
a second semiconductor element provided with a second insulating film structure which includes layer structure including the first insulating film and a second insulating film constituted of second high-dielectric insulating material with second etching rate different from the first etching rate, and which has second electric film thickness different from the first electric film thickness,
the first and the second semiconductor elements being formed on the same silicon substrate surface.

In the above case, the semiconductor device including plural kinds of semiconductor elements can be constituted such that the first and the second high-dielectric insulating material include elements with different constitution each other.

In the above case, the semiconductor device including plural kinds of semiconductor elements can be constituted such that the first and the second high-dielectric insulating material include elements with the same constitution and different ratio of composition each other.

In the above case, the semiconductor device including plural kinds of semiconductor elements can be constituted such that the first and the second high-dielectric insulating material have different crystal structure each other.

In the above case, the semiconductor device including plural kinds of semiconductor elements can be constituted such that at least one of the first and second insulating films continuously changes in the direction of the film thickness in at least any one of kinds of constitutive element and ratio of composition.

In the above case, the semiconductor device including plural kinds of semiconductor elements can be constituted such that the first and the second high-dielectric insulating material have different density each other.

In the above case, the semiconductor device including plural kinds of semiconductor elements can be constituted such that the first and the second insulating films have different profiles each other with respect to density of dangling bond in the films in the direction of film thickness.

In the above case, the semiconductor device including plural kinds of semiconductor elements can be constituted such that an interface layer constituted of at least any one of a silicon oxidation film, a silicon oxynitride film or a silicon nitriding film exists on interface between the first insulating film or the second insulating film, and relevant silicon substrate in at least one of the first and the second gate insulator films.

In the above case, the semiconductor device including plural kinds of semiconductor elements can be constituted such that the first and the second high-dielectric insulating material included in the second gate insulator film are different from each other in etching rate for wet-etching, and an insulating film constituted of insulating material with relatively high etching rate is extending on an insulating film constituted of insulating material with relatively low etching rate. In this case, for instance, the etching rate may be the etching rate for hydrofluoric acid solution.

In the above case, the semiconductor device including plural kinds of semiconductor elements can be constituted such that the first and the second high-dielectric insulating material included in the second insulating film structure are different from each other in etching rate for vapor phase etching, and an insulating film constituted of insulating material with relatively high etching rate is extending on an insulating film constituted of insulating material with relatively low etching rate. In this case, for instance, the etching rate may be the etching rate for vapor phase etching by fluorine radical.

In the above case, the semiconductor device including plural kinds of semiconductor elements can be constituted such that the layer structure including the first insulating film and the second insulating films comprises a layer modulated in composition in the direction of film thickness, underneath region of the layer being formed with a first insulating film constituted of the first high-dielectric insulating material and upper region of the layer being formed with a second insulating film constituted of the second high-dielectric insulating material.

A method for manufacturing a semiconductor device provided by fourth aspect of the present invention is;
a method for manufacturing a semiconductor device including plural kinds of transistors, wherein at least two kinds of transistors included in the plural kinds of transistors are formed on the same silicon substrate and have gate insulator films in which electric film thickness are different each other, and
wherein the semiconductor device includes, as the two kinds of transistors, a first transistor provided with a first gate insulator film including partially therein a first insulating film constituted of at least first high-dielectric insulating material, and a second transistor provided with a second gate insulator film including partially therein laminate structure of a first insulating film constituted of at least the first high-dielectric insulating material and a second insulating film constituted of second high-dielectric insulating material, the method constituted of;

a step for forming the first and second gate insulator films and the step at least including a step for forming layer structure including a first insulating film constituted of the first high-dielectric insulating material and a second insulating film constituted of the second high-dielectric insulating material and extending on the first insulating film, in a first forming region for forming the first transistor and in a second forming region for forming the second transistor, both regions being selected on the same silicon substrate, and a step for selectively removing the second insulating film while remaining the first insulating film at least in the first forming region.

In the above case, the method for manufacturing a semiconductor device may be constituted such that in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material. In this case, for instance, the etching solution may be hydrofluoric acid solution.

In the above case, the method for manufacturing a semiconductor device may be constituted such that in the step for selectively removing the second insulating film, the second insulating film is selectively etched and removed by vapor phase etching process utilizing fluorine radical with mid-level vapor phase density in which difference of etching rate exists between etching rate to the second high-dielectric insulating material and etching rate to the first high-dielectric insulating material.

In the above case, the method for manufacturing a semiconductor device may be constituted such that the method further includes a step for forming a base insulating film constituted of at least any one of a silicon oxidation film, a silicon oxynitride film and a silicon nitriding film in the first and second forming regions, thereby forming the first insulating film on the base insulating film.

In the above case, the method for manufacturing a semiconductor device may be constituted such that in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material or the base insulating film. In this case, for instance, the etching solution may be hydrofluoric acid solution.

In the above case, the method for manufacturing a semiconductor device may be constituted such that in the step for selectively removing the second insulating film, the second insulating film is selectively etched and removed by vapor phase etching process utilizing fluorine radical in which difference of etching rate exists between etching rate to the second high-dielectric insulating material and etching rate to the first high-dielectric insulating material or the base insulating film.

In the above case, the method for manufacturing a semiconductor device can be constituted such that the first and the second high-dielectric insulating material are formed to have different crystal structure each other by setting such that first temperature of the substrate when forming the first insulating film and second temperature of the substrate when forming the second insulating film are different from each other.

In the above case, the method for manufacturing a semiconductor device may be constituted such that the method further includes a step for subjecting the first and the second insulating films to heat treatment after carrying out a step of forming the second insulating film, temperature of the heat treatment being set such that at least one of the first and the second high-dielectric insulating material is improved on its property.

In the above case, the method for manufacturing a semiconductor device can be constituted such that the step for forming the first and the second insulating films comprises a step for forming the first insulating film constituted of the first high-dielectric insulating material in the first and the second forming regions and a step for forming the second insulating film constituted of the second high-dielectric insulating material on the first insulating film.

In the above case, the method for manufacturing a semiconductor device can be constituted such that the step for forming the first and the second insulating films comprises a step for forming the first insulating film constituted of the first high-dielectric insulating material in the first and second forming regions, a step for forming metal film on the first insulating film, a step for forming composition-modulated layers by subjecting the first insulating film and the metal film to heat treatment, the heat treatment causing that a reaction occurs between constitutive element of the first insulating film and constitutive element of the metal film, a laminated body of the first insulating film and the metal film is composition-modulated in the direction of the film thickness, underneath region is constituted of the first insulating film constituted of the first high-dielectric insulating material, and upper region is constituted of the second insulating film constituted of the second high-dielectric insulating material.

A method for forming first and second insulating film structure provided by fifth aspect of the present invention is;

a method for forming first and second insulating film structure with different electric film thickness each other on the same semiconductor substrate, the method including;

a step for forming layer structure including a first insulating film constituted of first high-dielectric insulating material and a second insulating film constituted of second high-dielectric insulating material extending on the first insulating film in a first selection region and a second selection region selected on the semiconductor substrate and a step for selectively removing the second insulating film while remaining the first insulating film at least in the first selection region.

In the above case, the method for forming first and second insulating film structure may be constituted such that in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material. In this case, for instance, the etching solution may be hydrofluoric acid solution the etching solution may be hydrofluoric acid solution.

In the above case, the method for forming first and second insulating film structure may be constituted such that.

In the above case, the method for forming first and second insulating film structure may be constituted such that in the step for selectively removing the second insulating film, the second insulating film is selectively etched and removed by vapor phase etching process utilizing fluorine radical with mid-level vapor phase density in which difference of etching rate exists between etching rate to the second high-dielectric insulating material and etching rate to the first high-dielectric insulating material.

In the above case, the method for forming first and second insulating film structure may be constituted such that the method further includes a step for forming a base insulating film constituted of at least any one of a silicon oxidation film, a silicon oxynitride film and a silicon nitriding film in the first and the second forming regions, thereby forming the first insulating film on the base insulating film.

In the above case, the method for forming first and second insulating film structure may be constituted such that in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material or the base insulating film. In this case, for instance, the etching solution may be hydrofluoric acid solution.

In the above case, the method for forming first and second insulating film structure may be constituted such that in the step for selectively removing the second insulating film, the second insulating film is selectively etched and removed by vapor phase etching process utilizing fluorine radical with mid-level vapor phase density in which difference of etching rate exists between etching rate to the second high-dielectric insulating material and etching rate to the first high-dielectric insulating material or the base insulating film.

In the above case, the method for forming first and second insulating film structure may be constituted such that the first and the second high-dielectric insulating material are formed to have different crystal structure each other by setting such that first temperature of the substrate when forming the first insulating film and second temperature of the substrate when forming the second insulating film are different from each other.

In the above case, the method for forming first and second insulating film structure may be constituted such that the method further includes a step for subjecting the first and the second insulating films to heat treatment after carrying out a step of forming the second insulating film, temperature of the heat treatment being set such that at least one of the first and the second high-dielectric insulating material is improved on its property.

In the above case, the method for forming first and second insulating film structure can be constituted such that the step for forming the first and the second insulating films comprises a step for forming the first insulating film constituted of the first high-dielectric insulating material in the first and the second forming regions and a step for forming the second insulating film constituted of the second high-dielectric insulating material on the first insulating film.

In the above case, the method for forming first and second insulating film structure can be constituted such that the step for forming the first and the second insulating films comprises;

a step for forming the first insulating film constituted of the first high-dielectric insulating material in the first and second forming regions, a step for forming metal film on the first insulating film, a step for forming composition-modulated layers by subjecting the first insulating film and the metal film to heat treatment, the heat treatment causing that a reaction occurs between constitutive element of the first insulating film and constitutive element of the metal film, a laminated body of the first insulating film and the metal film is composition-modulated in the direction of the film thickness, underneath region is constituted of the first insulating film constituted of the first high-dielectric insulating material, and upper region is constituted of the second insulating film constituted of the second high-dielectric insulating material.

BEST MODES FOR CARRYING OUT THE INVENTION

Figure 1A:
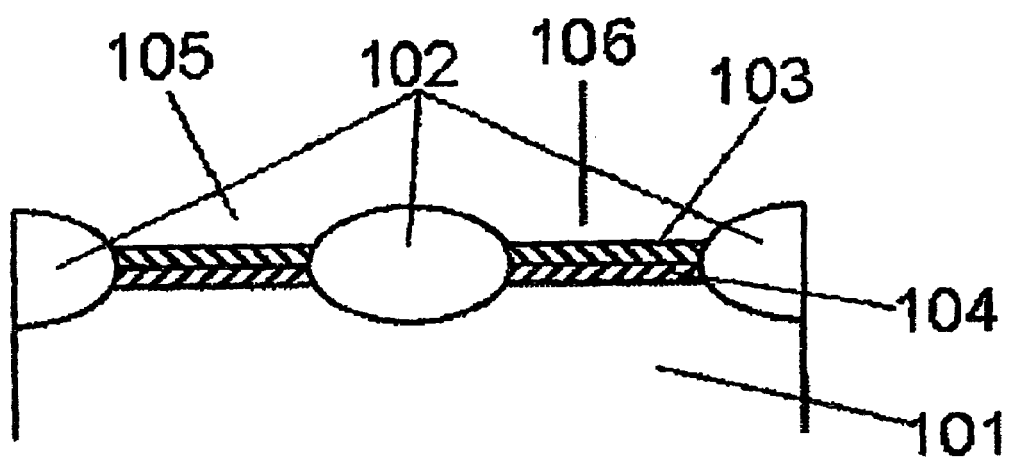
FIGS. 1A to 1C are partial longitudinal sectional views showing a series of basic multi-oxide process utilizing lamination structure including a plurality of insulating films constituted of high-dielectric insulating material in the manufacturing process of the semiconductor device according to the present invention.

The invention will be explained in more detail below.

According to the present invention with regard to plural kinds of transistors constituting a semiconductor device, when forming on the same silicon substrate the plural kinds of transistors having gate insulator films in which electric film thickness, that is, effective film thickness are different from each other, the one insulating film in which film thickness is relatively large is constituted to include lamination structure of thin films constituted of two kinds or more of high-dielectric insulating material with different etching rate, and the other insulating film in which film thickness is relatively small is constituted to thin electric film thickness by selectively etching at least one thin film of the high-dielectric insulating material among the thin films constituted of the two kinds or more of high-dielectric insulating material in the lamination structure. After once forming the lamination structure of the thin films constituted of two kinds or more of high-dielectric insulating material with different etching rate, multi-oxide process corresponding to a film of the high-dielectric insulating material is put into practice by utilizing a step for selectively etching the portion. Namely, by utilizing a film of the high-dielectric insulating material as the gate insulator film, leak electric current can be reduced increasing physical film thickness while maintaining necessary electric film thickness compared with the conventional case using silicon oxidation film.

Further by selecting high-dielectric insulating material with low etching rate as high-dielectric insulating material for the underneath layer compared with high-dielectric insulating material for upper and intermediate layers of the lamination structure, the upper and intermediate layers can be etched and removed partially and selectively in the etching step carried out after lamination while avoiding over-etching to the underneath layer, thereby producing plural kinds of gate insulator films having different electric film thickness with high repeatability.

Therefore, the present invention is to provides a constitution and manufacturing process of a semiconductor device enabling not to bleed problems such as fluctuation in film thickness of an insulating film and wafer contamination while employing high-dielectric insulating material and holding process expediency in the multi-oxide process.

Heretofore, silicon oxidation film (thermal oxidation film) or oxynitride film extensively used as an insulating material film for a gate insulator film is processed by etching in utilizing the technique of wet-etching which uses hydrofluoric acid solution, or reactive dry-etching which uses fluorine radical in gas plasma of CF system. Particularly in etching for a gate insulator film layer it is important not to introduce damage in processing, as much as possible in order to achieve good interface state between the gate insulator film layer and a channel layer of silicon substrate.

More specifically, from the above standpoint of view the technique of wet-etching which uses hydrofluoric acid solution without concern for the damage in processing is superior compared with the technique of reactive dry-etching as the technique of etching the gate insulator film layer.

On the other hand, $ZrO_2$ and $HfO_2$ to which research and development advances as high-dielectric insulating material applicable for use of the gate insulator film and etc., and further silicate material added silicon to them can be etched by the technique of wet-etching which uses hydrofluoric acid solution, and the technique of reactive dry-etching which uses fluorine radical, as the silicon oxidation film (thermal oxidation film) or the oxynitride film. In the case, one of major features of the high-dielectric insulating material is to widely change in etching rate depending on differences of constitutive elements or ratio of composition of the high-dielectric insulating material. Further in the high-dielectric insulating material, it is possible to deposit thin films having crystal or amorphous structure by appropriately setting technique of film forming and temperature of the substrate during film forming, and in doing so it is possible that etching rate has distinguished difference due to the crystal structure.

Figure 2:
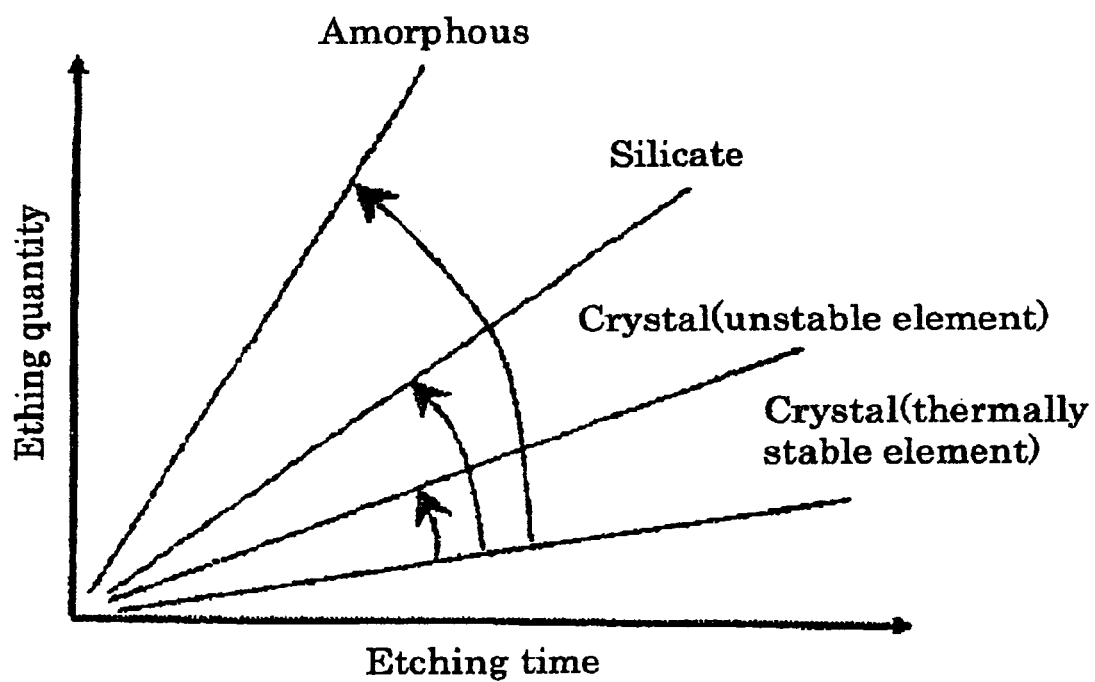
FIG. 2 is a view exemplarily showing general trend in relation to dependency of etching rate of high-dielectric insulating material on constitutive element, composition and crystal structure.

FIG. 2 illustrates exemplarily general trend in relation to dependency of etching rate of the high-dielectric insulating material on constitutive element, composition and crystal structure.

With respect to the difference in etching rate due to crystal structure and the difference in etching Tate pertaining to difference of composition in this high-dielectric insulating material, for instance, the trend illustrated in FIG. 2 is found in thin films of the high-dielectric insulating material which is considered as candidate material for the gate insulator film.

Generally, for instance, high-dielectric insulating and thermally stable metallic oxide material has a tendency for lowering etching rate. Also, compared with metallic oxide material in accordance with stoichometric composition, silicate material added silicon therein has a tendency for increasing etching rate. Further as described above, it is possible to form with high degree of freedom lamination structure of thin films having crystal or amorphous structure by appropriately selecting film forming conditions, and in doing so etching rate of the thin films having amorphous structure drastically increases, compared with those of amorphous structure.

In addition, etching rate in wet-etching by hydrofluoric acid solution or reactive dry-etching by utilizing fluorine radical is sensitive to with or without structural defect of material to be processed. More specifically, even though the films of high-dielectric insulating material are the same constitutive element or the same composition, density of the thin films obtained or disconnect joint density in the film (dangling bond density) greatly changes depending on difference of the film forming conditions. In the above technique of etching based on chemical reaction such as wet-etching or reactive dry-etching, etching rate depends on the structural defect in the film, particularly on dangling bond density. Namely, because etching starts from such a structural defect portion as an origin, etching rate increases as the dangling density increases. Also, because in the thin film with relatively lower density interatomic distance or bond angle is distorted from the most stable state, etching rate increases corresponding to lowering density of the thin film due to the mechanism, as in the case of etching acceleration originating on the structural defect.

With respect to a basic figuration of multi-oxide process utilized in manufacturing process for the semiconductor device of the present invention, the case will be explained in detail hereinafter taking as an example, in which two kinds of films of high-dielectric insulating material are different in etching rate.

Figure 1B:
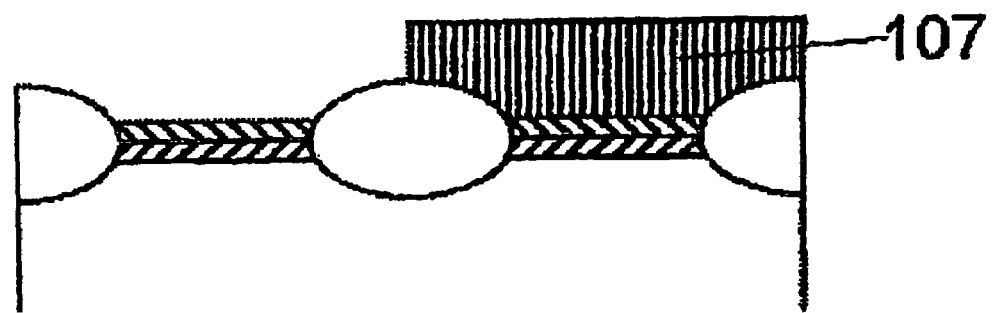
Figure 1C:
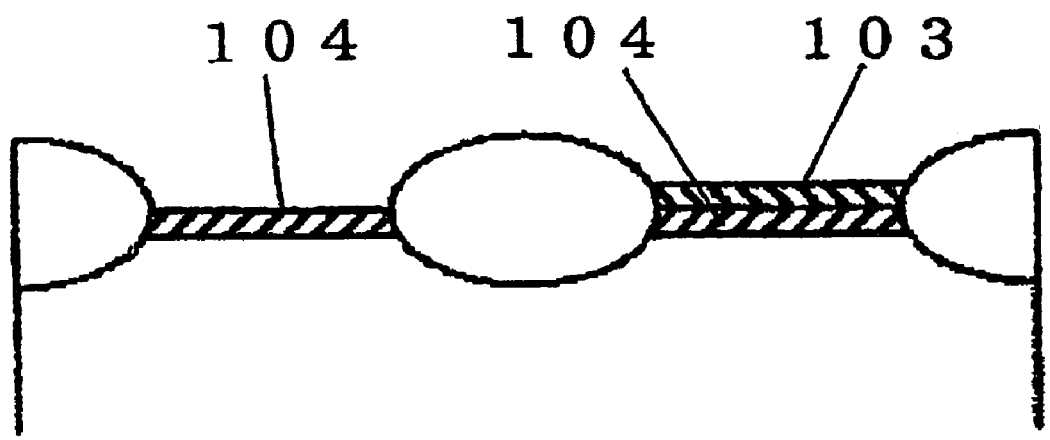

FIGS. 1A to 1C illustrates a series of basic multi-oxide process utilizing lamination structure including a plurality of insulating films constituted of high-dielectric insulating material in the manufacturing process of the semiconductor device according to the present invention. In one typical example for the multi-oxide process according to the present invention, in case of forming on silicon substrate surface lamination structure constituted of two kinds of thin films of high-dielectric insulating material with different etching rate the lamination structure is so formed such that the film of high-dielectric insulating material with lower etching rate is located in an underneath layer, and the film of high-dielectric insulating material with larger etching rate is located in an upper layer.

In the illustration shown in FIGS. 1A to 1C, high-dielectric insulating material A of the upper layer 103 is constituted of material with larger etching rate compared with that of high-dielectric insulating material B of the underneath layer 104. In case of simultaneously forming a transistor element having a gate insulator film with electric film thickness to be thin on the first region 105 and a transistor element having a gate insulator film with electric film thickness to be thin on the second region 106 by utilizing this lamination structure, selective etching process is carried out using resist mask 107 after masking the second region 106 with resist material.

Figure 3:
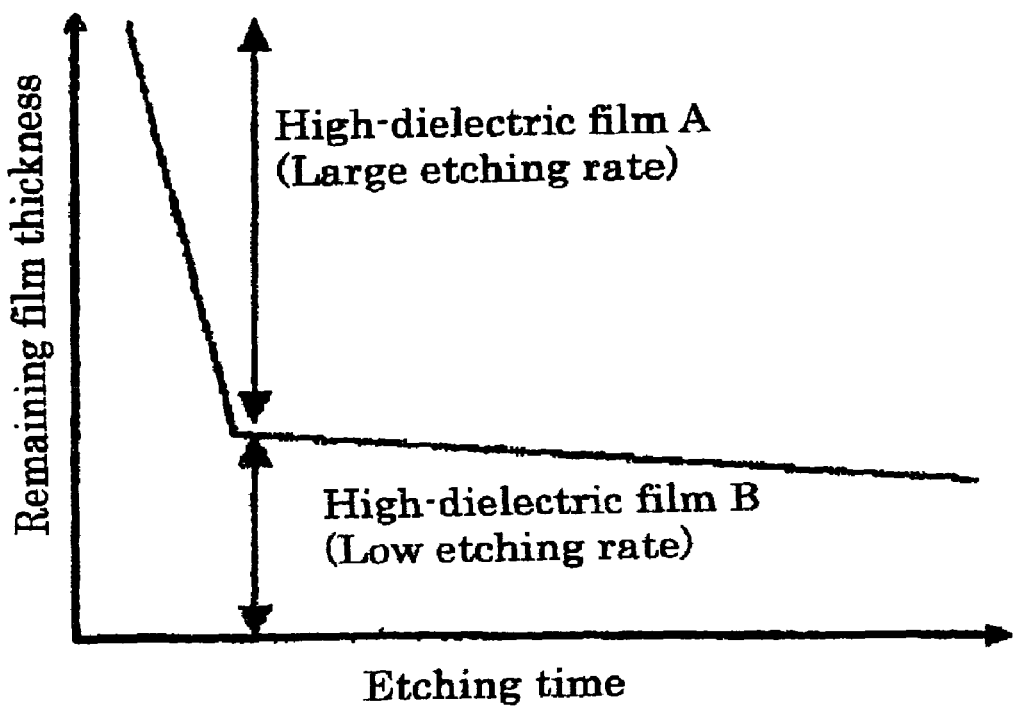
FIG. 3 is a view exemplarily showing variation of remaining film thickness with respect to etching time in a selective etching process utilizing etching rate difference for lamination structure constituted of thin films of high-dielectric insulating material with different etching rate.

FIG. 3 illustrates variation of remaining film thickness with respect to etching time in a selective etching process utilizing etching rate difference for lamination structure constituted of thin films of high-dielectric insulating material with different etching rate. As exemplarily shown in FIG. 3, because of different etching rate between two kinds of high-dielectric insulating material A and B moderate etching runs on in high-dielectric insulating material B of the underneath layer 104 exposed after high-dielectric insulating material A of the upper layer 103 has removed by etching. Therefore, by setting etching time a little longer than that necessary for completely removing the upper layer 103 of high-dielectric insulating material A, that is, by setting the etching time such that the upper layer 103 is over-etched it is possible to selectively strip off (etching) only the upper layer 103 of high-dielectric insulating material A.

Further an example of application for manufacturing process of transistor elements will be explained below, in which are provided with three kinds of gate insulator films with different electric film thickness on the same silicon substrate. In the case the three kinds of thin films A, B and C of high-dielectric insulating material are utilized wherein each thin film of high-dielectric insulating material is selected to be A>B>C in the order of largeness of etching rate. Then, in the first, lamination structure is so formed that the thin film A of high-dielectric insulating material exists in the underneath layer, the thin film B of high-dielectric insulating material exists in the intermediate layer and the thin film C of high-dielectric insulating material exists in the upper layer. In case of forming a gate insulator film layer with the thinnest electric film thickness in the first region 1, the first region 1 is subjected to the selective etching after protecting the second region 2 and the third region 3 using resist mask. In doing so it is possible to constitute the gate insulator film layer formed in the first region 1 of only the thin film C of high-dielectric insulating material in the underneath layer. In this case, with respect to the etching conditions for the first region 1 the etching rate and time is so selected to be suitable for exposing the surface of the thin film C of high-dielectric insulating material in the underneath layer, by selectively etching and removing thin film A of high-dielectric insulating material in the upper layer and thin film B of high-dielectric insulating material in the intermediate layer.

In the next, in case of forming a gate insulator film layer with the mid-level electric film thickness in the second region 2, only the second region 2 is subjected to the selective etching after protecting both of the first region 1 and the third region 3, or only the second region 2 using resist mask. In doing so it is possible to constitute the gate insulator film layer formed in the second region 2 of laminated layers with the thin film C of high-dielectric insulating material in the underneath layer and the thin film B of high-dielectric insulating material in the intermediate layer. In this case, with respect to the etching conditions the etching rate and time is so selected to be suitable for exposing the surface of the thin film B of high-dielectric insulating material in the intermediate layer, by selectively etching and removing only thin film A of high-dielectric insulating material in the upper layer.

In selective etching process for the foregoing first region 1 the etching needs to carry out to film B of high-dielectric insulating material in the intermediate layer. But, in selective etching process for this second region 2, because of etching only the film A of high-dielectric insulating material in the upper layer in which etching rate is largest, much more moderate and suppressing conditions of etching than those in selective etching process for the foregoing first region 1 are employed, for instance, lightening concentration of chemicals for use of wet-etching or lowering radical density for use of reactive dry-etching. Under such moderate etching conditions extremely moderate etching runs on in high-dielectric insulating material B in the intermediate layer exposed after high-dielectric insulating material film A in the upper layer has removed by etching. Therefore, by setting the etching time such that the upper layer is a little over-etched it is possible to selectively strip off (etching) only the film A layer of high-dielectric insulating material in the upper layer. Further even if the first region 1 is not subjected to protection of resist mask, it is possible to suppress decrease in the electric film thickness of the gate insulator film in the first region 1 to the extent of negligible small, because progression of etching is quite few to the thin film C of high-dielectric insulating material in the underneath exposed during all that time.

As the result the third region 3 is not subjected to etching, and there remains three layer structure wherein the thin film C of high-dielectric insulating material is the underneath layer, the thin film B of high-dielectric insulating material is the intermediate layer and the thin film A of high-dielectric insulating material is the upper layer. Accordingly, in the third region 3 a gate insulator film with the electric film thickness to be largest is formed as the result.

In addition, in accordance with different target electric film thickness of three kinds of gate insulator films which are formed in the first, the second and the third regions 1, 2 and 3 respectively, each film thickness can be appropriately designed with respect to the thin film C of high-dielectric insulating material in the underneath, the thin film B of high-dielectric insulating material in the intermediate layer and the thin film A of high-dielectric insulating material in the upper layer, based on the dielectric constant of each high-dielectric insulating material.

Specifically, in accordance with different target electric film thickness of gate insulator films which are formed in the first region 1 and the second region 2, each film thickness are uniquely determined with respect to the thin film C of high-dielectric insulating material in the underneath and the thin film B of high-dielectric insulating material in the intermediate layer, based on the dielectric constant of each high-dielectric insulating material, and then it is possible to uniquely select the film thickness of the thin film A, based on the dielectric constant of the thin film A of high-dielectric insulating material in the upper layer, so as to satisfy target electric film current thickness of the gate insulator film in the third region 3.

According to the manufacturing process of the semiconductor device of the present invention, in the series of the process which forms plural kinds of gate insulator films for transistor elements with different electric film thickness on the same silicon substrate utilizing multi-oxide process, it is possible to improve uniformity and repeatability of film thickness of the gate insulator film in each region of the elements compared with the conventional technique because selections of the target electric film thickness are carried out by selective etching and removal between respective layers with respect to high-dielectric insulating material films having lamination structure once deposited on the silicon substrate.

In addition, in each selective etching process, compared with etching rate to the thin film of high-dielectric insulating material to be removed, etching rate to the thin film of high-dielectric insulating material in the direct underneath layer exposed thereafter is selected to have significant slow tempo, and as the result, in the selective etching process to each layer, etching runs on imperceptibly to the thin film of high-dielectric insulating material in the direct underneath layer, even if time for over-etching is slightly added to the etching time. Accordingly, it is possible to broadly set process margin.

Further because selective etching process to each layer is carried out after forming multi-layer structure by sequentially depositing plural kinds of thin films of high-dielectric insulating material on the silicon substrate, in these regions forming plural kinds of insulating films the thin films of insulating material covering the silicon substrate surface are completely stripped off (removal by etching), and there is no process for exposing the silicon substrate surface itself. Therefore, it is possible to avoid a problem that in the process of etching or exfoliating resist interface between silicon substrate of element forming region and the gate insulator film is contaminated.

In addition, as previously described, it is also possible to manufacture the semiconductor device having transistors on the same silicon substrate, which are provided with three kinds or more of gate insulator films with different target electric thickness, by lamination structure of plural kinds of high-dielectric insulating material films, and plural times of selective etching process. In doing so, combination of each process in the multi-oxide process has an abundance of expediency and advantages in cost performance in connection with simplification of whole the process.

In addition, in case of selecting, as two continuous thin films constituted of lamination structure and with different etching rate, crystal structure and amorphous structure of high-dielectric insulating material films with same composition in the underneath layer and the upper layer and utilizing etching rate difference arising from difference of crystallinity, it is possible to improve electrical property of the thin film layer with amorphous structure and interfacial property of each layer by subjecting to re-heat treatment or crystallization process at desired temperature, after the selective etching process to each layer in the above multi-oxide process.

For instance, when the crystallization treatment completes to the thin film with amorphous structure the crystal structure layer acquired by the crystallization treatment of the upper layer becomes high-dielectric insulating material film by no means inferior to the pre-existent crystal structure layer of the underneath layer on the property. Therefore, in the two regions which have difference of only with or without the thin film layer of amorphous structure, these thin film layers of high-dielectric insulating material with crystal structure, after crystallization treatment, become substantially the same in the composition and crystal structure, though film thickness are different from each other.

Further in case of considering structure of a semiconductor device to which the above multi-oxide process is applicable, namely, considering, besides different kinds and plural of high-dielectric insulating material films, operation of a device element having lamination structure in which silicon oxidation film or oxynitride film is added, the added silicon oxidation film or oxynitride film contributes to low electric power consumption of the whole device and to high performance of the device in which high speed operation is required.

In order to lower electric power consumption, particularly to reduce leak current component in the gate insulator film, besides increase of physical film thickness by high-dielectric of insulating material used for gate insulator film, it is desirable to sufficiently increase band-offset of valence band and conduction band in the interface of the gate insulator film and the silicon substrate. It is generally known that dielectric constant of insulating material and band gap have a negative correlationship, and band offset in the interface of high-dielectric insulating material and silicon substrate is small.

In the semiconductor device of the present invention, from the view point of reduction in leak current, it is possible to design gate insulator film structure that causes to avoid decrease of band offset in the interface of the gate insulator film and the silicon substrate, and to effectively suppress leak current by combination of high-dielectric insulating material with relatively wide band gap and insulating material with high dielectric constant.

More specifically, it is possible to utilize lamination structure combined by use of a silicon oxynitride film or a silicon nitride film as the high-dielectric insulating material with relatively wide band gap and use of such as $ZrO_2$ or $HfO_2$ and etc. (described later) as the insulating material with high dielectric constant. Instead, in the interface of the gate insulator film and the silicon substrate any one of a silicon oxidation film, a silicon oxynitride film and a silicon nitride film is formed so as to exist as the interface layer. This interface layer is superior in affinity with silicon substrate and constitutes an insulating material film with large band offset. It is also possible to form a layer of the high-dielectric insulating material on this interface layer.

Further though in the above description lamination structure constituted of only the thin film of high-dielectric insulating material is explained as an example regarding the figuration of embodiment of the present invention, it is also possible for another figuration of embodiment that a silicon oxidation film or an oxynitride-film as a base insulating film is located in the interface of a gate insulator film and silicon substrate, and thereon the above lamination structure constituted of the thin film of high-dielectric insulating material is formed. In doing so, insertion of the silicon oxidation film as a base insulating film into the interface of the thin film of high-dielectric insulating material and the silicon substrate is effective from the standpoint of improvement of electrical property in the interface. Also, insertion of the oxynitride film as the base insulating film into the interface of the thin film of high-dielectric insulating material and the silicon substrate is effective to suppress reaction in the interface. Also, because of the similar reasons, insertion of the silicon oxidation film or the oxynitride film into a junction interface of a polysilicon electrode mounted on a gate insulator film or a polysilicon germanium electrode (upper electrode) as a gate electrode and gate insulator film structure is effective to suppress current infusion effect from the upper electrode.

In addition, there are a variety of figurations in combination of lamination structure constituted of the thin film of high-dielectric insulating material and the silicon oxidation film or the oxynitride film from a view point of circuit design for whole the semiconductor device. For instance, it is possible to reduce leak current by constituting a region in thin electric film thickness with a thin film of high-dielectric insulating material. However, as pointed out long before, in the thin film of high-dielectric insulating material, there is a problem of low reliability compared with the silicon oxidation film and further there exist unresolved issues on application for the device arising from fixed charge in the film and interface defect. Therefore, it is necessary to select best suited insulating film for each element constituting the semiconductor device. For instance, as for an element required for high electric current drivability, the leak current beyond ordinary level of the design criterion to the element may be permitted by using thinner silicon oxidation films or oxynitride films. On the contrary, as for an element constituting circumferential circuit of the device, it is effective to constitute whole the semiconductor device so as to drastically suppress electric power consumption by using thin films of high-dielectric insulating material.

Accordingly, in the etching process to the thin film of insulating material by manufacturing method of the present invention, it is desirable to exclude physical effect as much as possible and utilize wet-etching based on chemical reaction or reactive dry-etching by use of radical species in order to realize selective etching among the thin film of different high-dielectric insulating material, the silicon oxidation film or the oxynitride film. Particularly, wet-etching using hydrofluoric acid solution is applicable for etching not only the silicon oxidation film or the oxynitride film, but also many thin films of high-dielectric insulating material, and further wet-etching rate remarkably changes depending on constitution element, composition or crystal structure of the high-dielectric insulating material.

Also in dry-etching method, it is effective to employ, for instance, reactive dry-etching process by reaction with radical species, as the etching means for main mechanism of chemical reaction with radical species in which sputtering effect accompanied by high energy-ion irradiation is excluded. Further in order to realize selective etching with high controllability, it is desirable to select etching conditions wherein relatively large etching rate to the upper layer is about several angstroms per second.

On the other hand, it is desirable to select etching conditions wherein relatively low etching rate to the underneath layer is $1/10 \sim 1/100$ of the last etching rate.

Typical example of high-dielectric insulating material available when the present invention is implemented includes $ZrO_2$, $HfO_2$, $Ta_2O_5$, $Al_2O_3$, $Nb_2O_5$, and $Sc_2O_3$, $Y_2O_3$ which are oxide of rare-earth element, or $La_2O_3$, $CeO_2$, $Pr_2O_3$, $Nd_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$ which are oxide of lanthanoid element, and further includes silicate material derived from those metallic oxide, but does not limit to them. Also, light element such as nitrogen or fluorine is available for addition element which changes etching rate to thin films of those high-dielectric insulating material.

Further in the above description lamination structure utilizing difference of etching rate is already explained which arises from difference of constitution element or composition and crystal structure of the thin film of high-dielectric insulating material. Further more, difference of etching rate exists in structure in which composition continuously changes in the direction of film thickness of the thin film of high-dielectric insulating material, namely, in composition modulated structure, as the result similar effect of selective etching can be obtained. In the case, change of etching rate is continuous in the thin film of high-dielectric insulating material having composition modulated structure which has moderate change of composition in the direction of film thickness compared with lamination structure having sharp change of composition. For this reason, process margin during selective etching becomes relatively narrow. Also, there is a tendency with a little inferior compared with lamination structure in uniformity and repeatability with regard to film thickness of high-dielectric insulating material film remaining after processing by selective etching. In this regards, though restriction of higher controllability in process exists, it is possible to improve electrical property in the film and junction interface by continuously modulating composition in the high-dielectric insulating material film.

The present invention will be explained more specifically by preferred embodiments. In addition, though these embodiments are examples of best mode concerning a semiconductor device related to the present invention, namely, the semiconductor device including a transistor having plural kinds of gate insulator films with different film thickness, which are formed on the same silicon substrate by multi-oxide process utilizing lamination structure of thin films of high-dielectric insulating material, and a method for manufacturing therefor, but the present invention is not limited to these embodiments.

(Embodiment 1)

FIGS. 4A to 4D illustrate a series of process for manufacturing a semiconductor device of the first embodiment by means of multi-oxide process including a selective etching step to lamination structure of $ZrSio/Zro_2/SiO_2$ in application of a method for manufacturing a semiconductor device of the present invention. In the semiconductor device of the embodiment 1 the lamination structure with two kinds of thin films of high-dielectric insulating material constituted of a film 404 of $ZrO_2$ and a film 405 of Zr silicate (ZrSiO) is utilized for the purpose of forming plural kinds of gate insulator films with different electrical film thickness. In addition in the semiconductor device of the embodiment 1 the detailed element structure of each transistor, such as side walls pertaining to the gate electrode 409, which is used to form LDD structure are omitted in the drawing for the purpose to simplify the explanation.

Figure 4A:
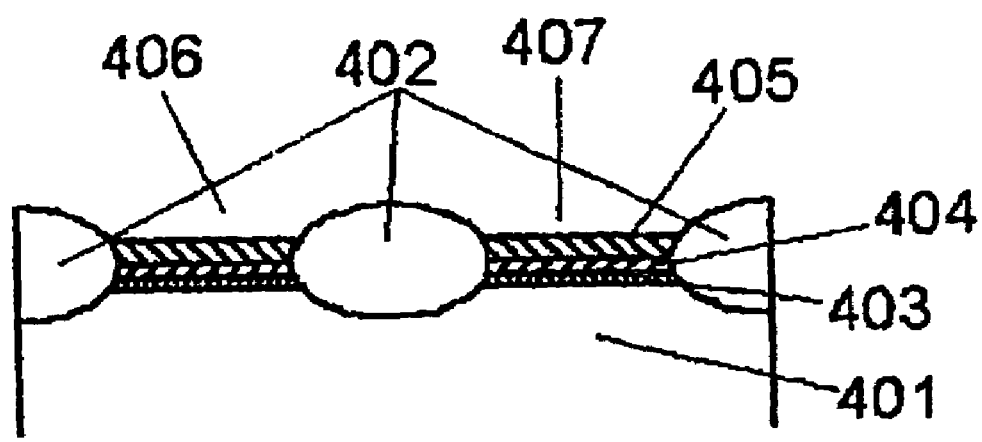
FIGS. 4A to 4D are partial longitudinal sectional views showing a series of process for manufacturing a semiconductor device of the first embodiment by means of multi-oxide process including a selective etching step to lamination structure of $ZrSio/Zro_2/Sio_2$ in application of a method for manufacturing a semiconductor device of the present invention.

FIG. 4A shows a region divided by the oxidation film 402 for element separation as the first region 406 and the second region 407 to form two kinds of transistors provided on the surface of the silicon substrate 401. Firstly, after cleaning the silicon substrate, a thermal oxidation film (silicon oxidation film) 403 with the film thickness of 0.5 nm is formed on the surface of the first region 406 and the second region 407. This silicon oxidation film 403 is inserted for the purpose of improving interface thermal stability and electrical property of the silicon substrate 401 and a thin film 404 of $ZrO_2$(to be mentioned later) as a base insulating film layer. Then the thin film 404 of $ZrO_2$ with the film thickness of 2.5 nm having crystal structure is deposited on the surface of the silicon oxidation film 403 with the raw material of $ZrCl_4$ and $H_2O$ by the process of CVD (Chemical Vapor Deposition). Continuously, by adding raw material gas of $Si_2H_6$ to the film forming condition of the CVD process and depositing a thin film 405 of Zr silicate (ZrSiO) with the film thickness of 6 nm, lamination structure of $ZrSiO/ZrO_2/SiO_2$ is formed, wherein the thin film 405 of Zr silicate has amorphous structure.

Figure 4B:
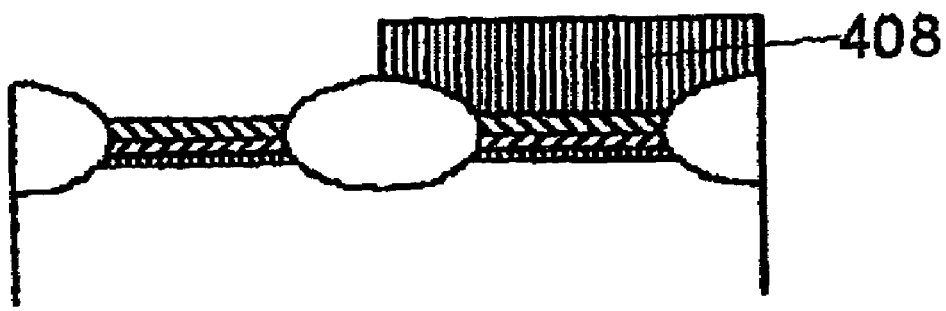

FIG. 4B shows the resist mask 408 utilized in a step for selectively etching and removing only silicate thin film 405 on the first region 406. This resist mask 408 protects the surface of the second region 407, and is provided with an opening portion on the first region 406. Etching to the silicate film 405 is carried out by diluting hydrofluoric acid solution while utilizing the resist mask 408. Etching rate to the silicate film 405 is about one hundred times of that to the crystal film 404 of $ZrO_2$, and for instance, even in case of setting the etching time to the silicate film such that etching quantity of 12 nm is carried out, that is, the over-etching time of 200%, etching quantity to the exposed film 404 of $ZrO_2$ reaches at most 0.06 nm, thereby realizing the ideal selective etching as illustrated in FIG. 3.

Figure 4C:
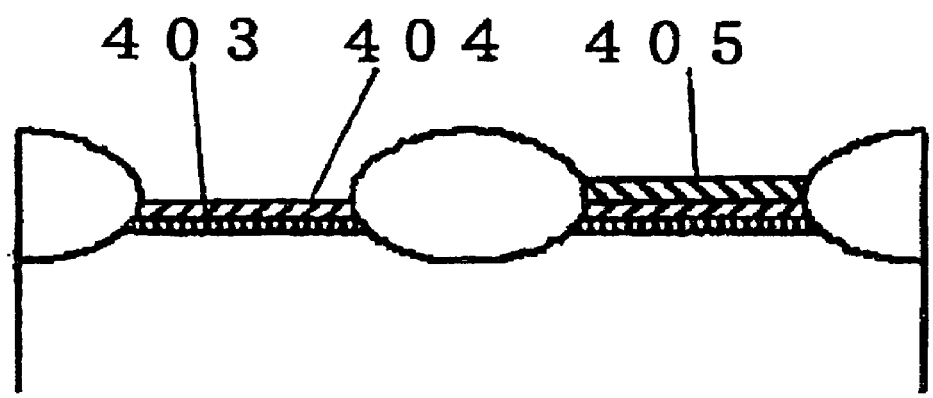

FIG. 4C shows a state wherein the resist mask has been stripped off and removed after finishing the selective etching process to the first region 406. After exfoliating of the resist re-heat treatment to the film 405 of Zr silicate with amorphous structure is carried out at 700° C. in nitrogen atmosphere to improve film quality. As the result, a gate insulator film of lamination structure of $Zro_2/Sio_2$ is formed on the first region 406, and on the other hand a gate oxidation film improved in film quality of lamination structure of $ZrSiO/Zro_2/Sio_2$ is formed on the second region 407.

Figure 4D:
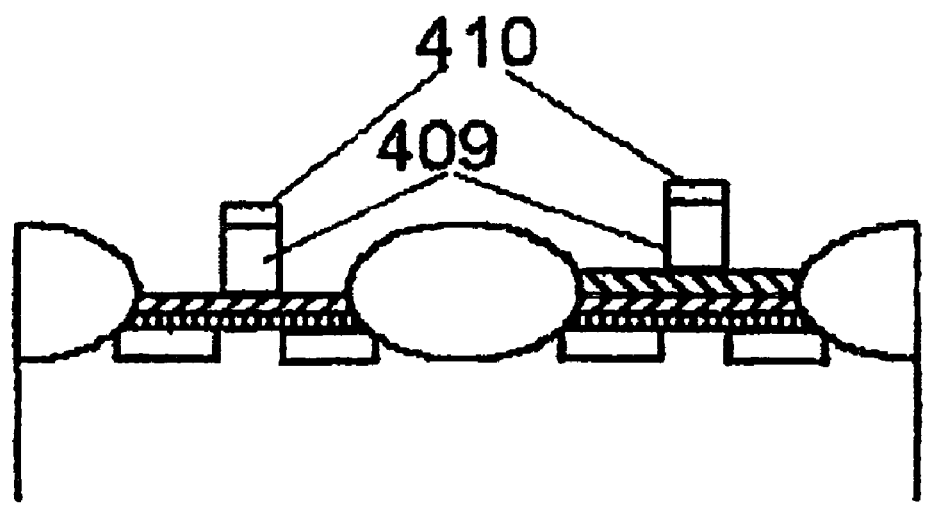

FIG. 4D shows a state of a transistor formed thereafter in accordance with the conventional process in which forming of source and drain is carried out by ion implantation while utilizing the polysilicon gate electrode 409 and the pertaining side wall. Also, there remains silicide layer 410 used in such process on the polysilicon gate electrode 409.

In the semiconductor device according to the embodiment 1, the gate insulator film of the transistor formed in the first region 406 is lamination structure of $Zro_2/Sio_2$ with thin electric film thickness, and the gate insulator film of the transistor formed in the second region 407 is lamination structure improved in film quality of $ZrSiO/Zro_2/Sio_2$ with relatively large electric film thickness. According to the result in actual measurement of electric film thickness converted to silicon oxidation film, namely, equivalent oxidation film thickness and values of leak current with respect to each gate insulator film, in a thin film layer region of the first region 406 equivalent oxidation film thickness is 1.0 nm, and leak current is 2 $A/cm_2$ when applying 1 volt, and in a thick film layer region of the second region 407 equivalent oxidation film thickness is 3.0 nm, and leak current is less than $10^{-10}$ A/cm2 when applying 1 volt. Therefore, more than 3~4 orders of leak current reduction effect can be achieved, compared with the conventional usage of silicon oxidation film having the same equivalent oxidation film thickness.

Also, according to the result in evaluating fluctuation on film thickness of each gate insulator film from the stand point of device property with respect to the element of each region in the same silicon substrate, the fluctuation on film thickness of the insulating film can be reduced to the extent of less than half, compared with the case in forming by the conventional multi-oxide process.

Further, in the above manufacturing process, because of including no process in which silicon substrate surface is exposed after forming the lamination structure, it is possible to suppress the occurrence of interface defect (interface fixed charge) accompanied by contamination of the gate insulator film layer and silicon substrate interface and the occurrence of precursor to the interface defect, and to improve reliability for long time usage of the formed element.

(Embodiment 2)

FIGS. 5A to 5D are partial longitudinal sectional views showing a series of process for manufacturing a semiconductor device of the second embodiment by means of multi-oxide process including a selective etching step to lamination structure of amorphous $Zro_2$/crystal $Zro_2/SiO_2$ in application of a method for manufacturing semiconductor device of the present invention.

In the semiconductor device of the embodiment 2 the lamination structure with two kinds of thin films of high-dielectric insulating material constituted of a crystal film 504 of $ZrO_2$ and an amorphous film 505 of $ZrO_2$ is utilized for the purpose of forming plural kinds of gate insulator films with different electrical film thickness. In addition in the semiconductor device of the embodiment 2 the detailed element structure of each transistor, such as side walls pertaining to the gate electrode 510, which is used to form LDD structure are omitted in the drawing for the purpose to simplify the explanation.

Figure 5A:
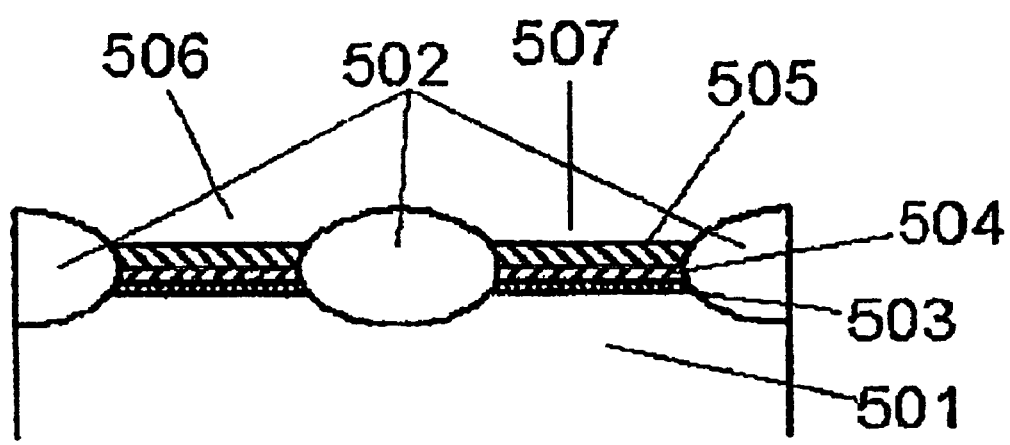
FIGS. 5A to 5D are partial longitudinal sectional views showing a series of process for manufacturing a semiconductor device of the second embodiment by means of multi-oxide process including a selective etching step to lamination structure of amorphous $Zro_2$/crystal $Zro_2/SiO_2$ in application of a method for manufacturing semiconductor device of the present invention.

FIG. 5A shows a region divided by the oxidation film 502 for element separation as the first region 506 and the second region 507 to form two kinds of transistors provided on the surface of the silicon substrate 501. Firstly, after cleaning the silicon substrate, a thermal oxidation film (silicon oxidation film) 503 with the film thickness of 0.5 nm is formed on the surface of the first region 506 and the second region 507. This silicon oxidation film 503 is inserted for the purpose of improving interface thermal stability and electrical property of the silicon substrate 501 and a thin film 504 of $ZrO_2$ (to be mentioned later) as a base insulating film layer. Then the thin film 504 of $ZrO_2$ with the film thickness of 2.5 nm having crystal structure is deposited on the surface of the silicon oxidation film 503 with the raw material of $ZrCl_4$ and $H_2O$ by the process of CVD. Continuously, the film 505 of $ZrO_2$ with the film thickness of 12.0 nm is formed by sputtering process using a target of $ZrO_2$ on the film 504 of $ZrO_2$ formed by the CVD. In addition, when the sputtering process is carried out on the condition that the substrate temperature is room temperature, composition of the film formed has stoichiometrical composition of $ZrO_2$, but the film structure is constituted of amorphous or micro crystalline of the scale of several nm.

Figure 5B:
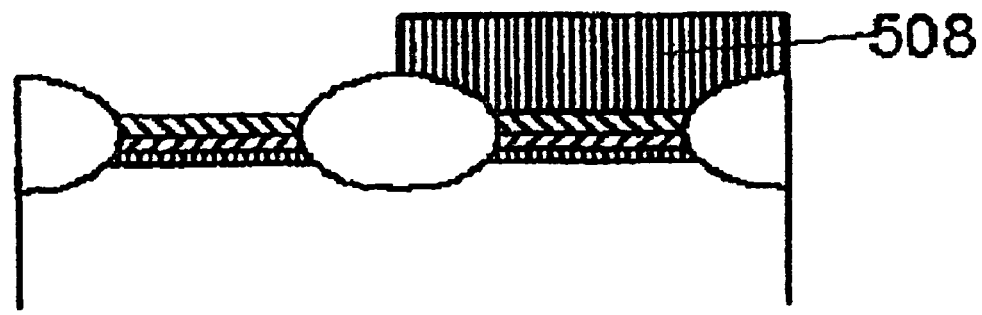

FIG. 5B shows the resist mask 508 utilized in a step for selectively etching and removing only the amorphous film 505 of $ZrO_2$ formed by sputtering on the first region 506. This resist mask 508 protects the surface of the second region 507, and is provided with an opening portion on the first region 506. Etching to the amorphous film 505 of $ZrO_2$ is carried out by diluting hydrofluoric acid solution while utilizing the resist mask 508. Etching rate to the amorphous film 505 of $ZrO_2$ is about 10~100 times of that to the crystal film 504 of $ZrO_2$, and for instance, by controlling the etching time to the amorphous film 505 of $ZrO_2$ such that etching quantity of 12 nm is carried out, and the over-etching time does not lengthen unnecessarily, etching quantity to the exposed crystal film 504 of $ZrO_2$ can be suppressed to the extent of negligible small, thereby enabling the good selective etching.

Figure 5C:
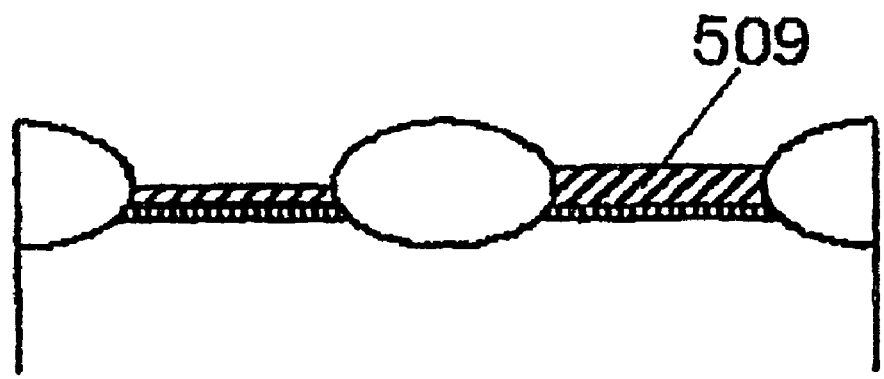

FIG. 5C shows a state wherein the resist mask has been stripped off and removed after finishing the selective etching process to the first region 506. After exfoliating of the resist re-heat treatment to the amorphous film 505 of $Zr\ O_2$ is carried out at 700° C. in nitrogen atmosphere to improve film quality. By the heat treatment crystallization of remained amorphous layer of $ZrO_2$ runs on in the second region 507. As the result, in the second region 507 gate oxidation film of lamination structure of crystallized $ZrO_2/ZrO_2/SiO_2$ is formed, and in the event, crystallized film of $ZrO_2$ and crystal film 504 of $ZrO_2$ are not different substantially in crystal structure and constitute the single layer-like film 509 of $ZrO_2$.

Figure 5D:
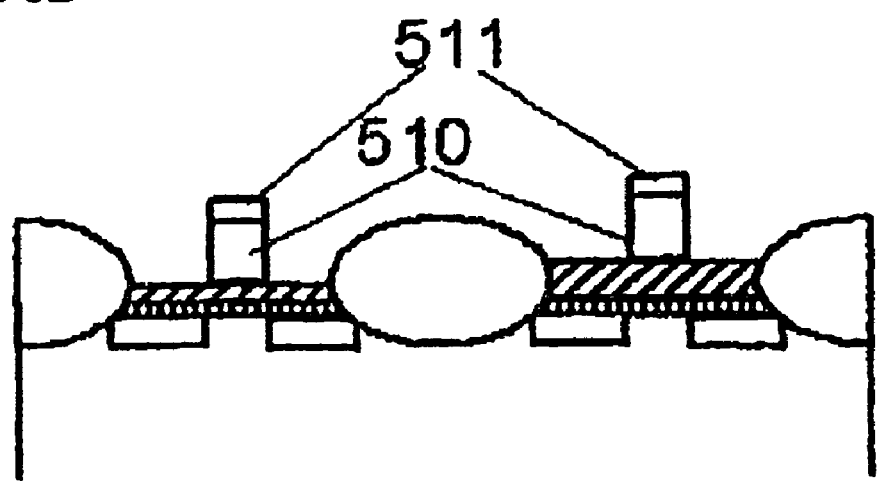

FIG. 5D shows a state of a transistor formed thereafter in accordance with the conventional process in which forming of source and drain is carried out by ion implantation while utilizing the polysilicon gate electrode 510 and the pertaining side wall. Also, there remains silicide layer 511 used in such process on the polysilicon gate electrode 510.

In the semiconductor device according to the embodiment 2, the gate insulator film of the transistor formed in the first region 506 is lamination structure of $Zro_2/SiO_2$ with thin electric film thickness, and the gate insulator film of the transistor formed in the second region 507 is a single layer-like lamination structure of $Zro_2/Sio_2$ with relatively large electric film thickness. According to the result in actual measurement of electric film thickness converted to silicon oxidation film (equivalent oxidation film thickness) and values of leak current with respect to each gate insulator film, in a thin film layer region of the first region 506 equivalent oxidation film thickness is 1.0 nm, and leak current is 2 $A/cm_2$ when applying 1 volt, and in a thick film layer region of the second region 507 equivalent oxidation film thickness is 3.4 nm, and leak current is less than $10^{-11}$ $A/cm_2$ when applying 1 volt.

Also, according to the result in evaluating fluctuation on film thickness of each gate insulator film from the stand point of device property with respect to the element of each region in the same silicon substrate, the fluctuation on film thickness of the insulating film can be suppressed as in the above case of embodiment 1, compared with the case in forming by the conventional multi-oxide process.

Also in the above manufacturing process, there is no process in which the silicon substrate surface is exposed after forming the lamination structure, and as the result it is possible in the gate insulator film to suppress deterioration of electric property arising from the interface roughness or the interface defect of the film inside and to improve reliability of the formed element. Particularly, in the embodiment 2, the second region 507 becomes a single layer of $ZrO_2$ in the course of crystallization of the amorphous portion in the gate insulator film, and as the result it is possible to reduce total electrical interface defect, compared with employing lamination structure of thin films of different kinds of high-dielectric insulating material.

(Embodiment 3)

FIGS. 6A to 6D are partial longitudinal sectional views showing a series of process for manufacturing a semiconductor device of the third embodiment by means of multi-oxide process including a selective etching step to lamination structure of ZrSio/SioN in application of a method for manufacturing semiconductor device of the present invention. In the semiconductor device of the embodiment 3 the lamination structure with two kinds of thin films of high-dielectric insulating material constituted of a film 604 of SiON (silicon oxynitride film) and a film 605 of ZrSiO (Zr silicate film) is utilized for the purpose of forming plural kinds of gate insulator films with different electrical film thickness. In addition in the semiconductor device of the embodiment 3 the detailed element structure of each transistor, such as side walls pertaining to the gate electrode 510, which is used to form LDD structure are omitted in the drawing for the purpose to simplify the explanation.

Figure 6A:
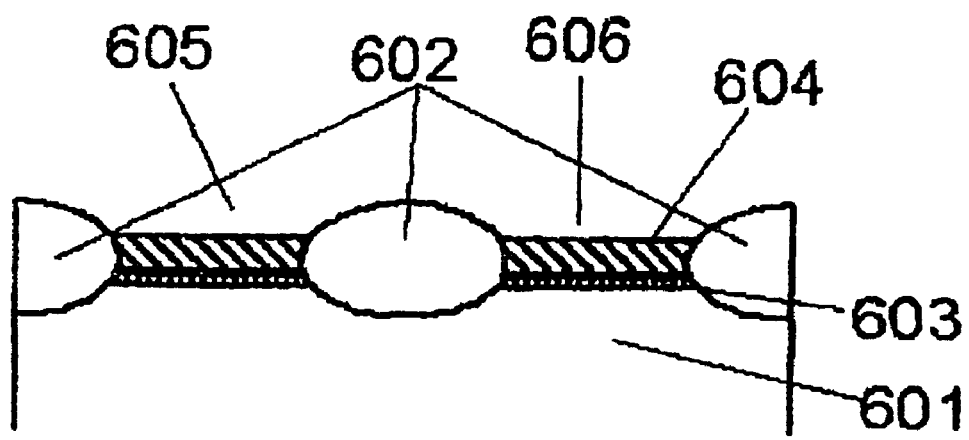
FIGS. 6A to 6D are partial longitudinal sectional views showing a series of process for manufacturing a semiconductor device of the third embodiment by means of multi-oxide process including a selective etching step to lamination structure of ZrSio/SioN in application of a method for manufacturing semiconductor device of the present invention.

FIG. 6A shows a region divided by the oxidation film 602 for element separation as the first region 605 and the second region 606 to form two kinds of transistors provided on the surface of the silicon substrate 601. Firstly, after cleaning the silicon substrate, a thermal oxidation film (silicon oxidation film) with the film thickness of 1.5 nm is formed on the surface of the first region 605 and the second region 606. This surface of silicon oxidation film is subjected to nitriding treatment by exposing to radical nitrogen atom generated with nitrogen gas in plasma. In many case nitriding reaction under radical irradiation runs on in radical oxynitride film formed by nitriding treatment of silicon oxidation film, and the physical film thickness at the nitriding portion increases together with progression of high-dielectric. In the embodiment 3, however because of converting to silicon oxynitride film (SiON) 603 keeping the equivalent film thickness to oxidation film to be 1.5 nm, it is possible reduce leak current by the orders of 1.5 compared with the silicon oxidation film. Thereafter lamination structure of ZrSio/SioN is formed by forming a film 604 of ZrSio with the film thickness of 10.0 nm utilizing CVD process on the silicon oxynitride film 603 according as described in embodiment 1.

Figure 6B:
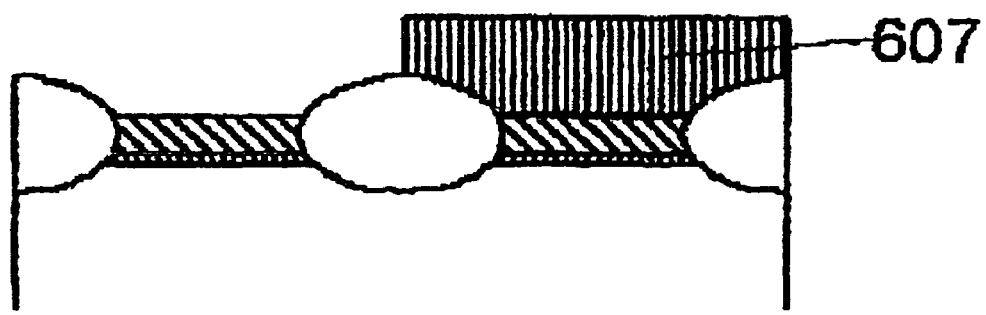

FIG. 6B shows the resist mask 607 utilized in a step for selectively etching and removing only the film 604 of ZrSiO formed by CVD process on the first region 605. The resist mask 607 protects the surface of the second region 606, and is provided with an opening portion on the first region 605. Etching to the film 604 of ZrSiO is carried out by diluting hydrofluoric acid solution while utilizing the resist mask 607. Etching rate to the film 604 of ZrSiO is about 100 times of that to the film 603 of SiON, and for instance, by controlling the etching time to the film 603 such that etching quantity of 10 nm is carried out, and the over-etching time does not lengthen unnecessarily, etching quantity to the exposed film 603 of SiON can be suppressed to the extent of negligible small, thereby enabling the good selective etching.

Figure 6C:
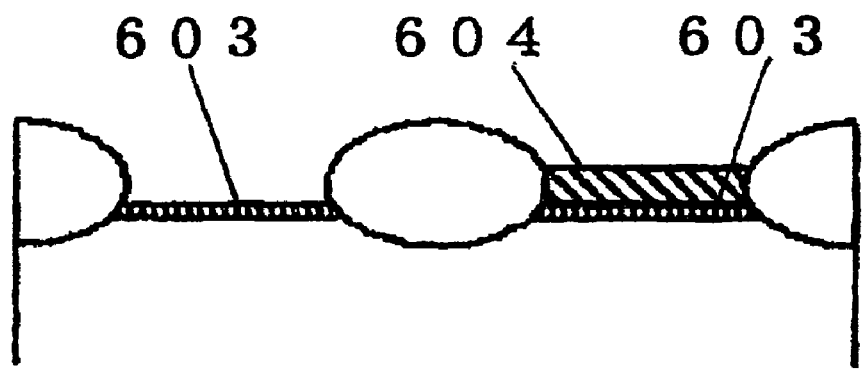

FIG. 6C shows a state wherein the resist mask 607 has been stripped off and removed after finishing the selective etching process to the first region 605. After exfoliating of the resist re-heat treatment to the film 604 of ZrSiO with amorphous is carried out at 700° C. in nitrogen atmosphere to improve film quality. As the result, a gate oxidation film improved in film quality of lamination structure of ZrSiO/SioN is formed on the second region 606.

Figure 6D:
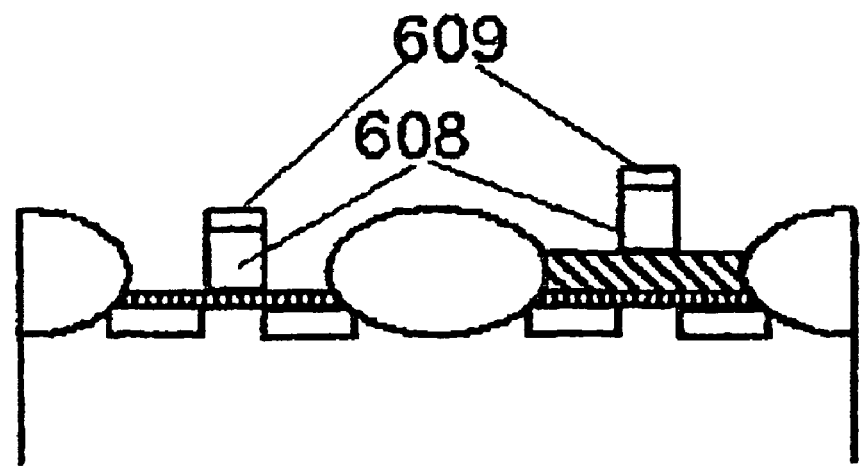

FIG. 6D shows a state of a transistor formed thereafter in accordance with the conventional process in which forming of source and drain is carried out by ion implantation while utilizing the polysilicon gate electrode 608 and the pertaining side wall. Also, there remains silicide layer 609 used in such process on the polysilicon gate electrode 608.

According to evaluation of electric property on each insulating film in the semiconductor device formed by the embodiment 3, with respect to the transistor formed in the first region 605 the gate insulator film is only the film of SiON and holds the above electric property, that is, the equivalent film thickness to oxidation film to be 1.5 nm because reducing in film thickness by selective etching is negligible small. On the other hand, with respect to the transistor formed in the second region 606 the gate insulator film is lamination structure of ZrSiO/SiON improved in film quality, and according to the result of measurement of electric film thickness converted to silicon oxidation film, that is, the equivalent film thickness to oxidation film and leak current are 4.0 nm and less than $10^{-11}$ A/cm$_2$ (when applying 1 volt) respectively on the thick film region of the second region 606.

In the structure of the semiconductor device of the embodiment 3, electric power consumption of the element improved in current drivability formed in the first region 605 is higher than those of the first region in the embodiment 1 or the embodiment 2. However, by employing the film of SiON as the gate insulator film it is possible to suppress the generation of fixed charge inside film or interface defect remaining as the problem in many high-dielectric insulating material films. Further reliability is increased compared with structure utilizing the gate insulator film with lamination structure of ZrO$_2$/SiO$_2$ in the embodiment 1 or embodiment 2.

(Embodiment 4)

As the fourth embodiment of the present invention a semiconductor device is formed according as the process described in the embodiment 1 by employing lamination structure of ZrAlO$_2$/ZrO$_2$, instead of lamination structure of ZrSiO/ZrO$_2$ described in the embodiment 1 as shown in FIGS. 4A to 4D.

The first region and the second region for forming two kinds of transistors to be formed are divided each other by the oxidation film for separating element on the silicon substrate surface. A film of ZrO$_2$ with film thickness of 4 nm is formed in the first region and the second region by sputtering process after cleaning the silicon substrate. Continuously, a film of ZrAlO$_2$ in which Al is added on the film of ZrO$_2$ by sputtering using target of ZrAlO$_2$ is formed which constitutes lamination structure of ZrAlO$_2$/ZrO$_2$. The film of ZrO$_2$ and the film of ZrAlO$_2$ in which Al is added on the film of ZrO$_2$ formed by sputtering are both amorphous structure. Addition of Al is effective to suppress crystallization of the thin film of ZrO$_2$, and when such lamination structure is subjected to heat treatment at 600° C. in nitrogen atmosphere, crystallization only to the film of ZrO$_2$ of the underneath layer advances selectively.

The etching rate to the film of ZrAlO$_2$ with amorphous structure by diluting hydrofluoric acid solution is about ten times than that of the crystallized film of ZrO$_2$, and as described in the embodiment 1, only the film of ZrAlO$_2$ of the first region is selectively etched and removed by utilizing the resist mask. Then, by exfoliating the resist mask the gate insulator film with crystal film of ZrO$_2$ in the first region and the gate insulator film with lamination structure of ZrAlO$_2$/ZrO$_2$ in the second region are formed, respectively.

In the process thereafter, according as the steps described in the embodiment 1 the transistor is made by forming the gate electrode and the source/drain region. Also, as to the gate insulator film constituted of these films of high-dielectric insulating material with different film thickness in the first region and the second region of the embodiment 4, the uniformity in film thickness of gate insulator film in the same substrate and the electric property are improved as in the above embodiment 1.

(Embodiment 5)

FIGS. 7A to 7E show a series of process for manufacturing a semiconductor device of the fifth embodiment by means of multi-oxide process including a selective etching step to film structure of film of Zro$_2$ (film of ZrSio) modulated in composition in the direction of the film thickness in application of a method for manufacturing semiconductor device of the present invention.

In the semiconductor device of the embodiment 5 there is utilized the lamination structure constituted of the film 707 of ZrO$_2$ (ZrSiO) modulated in composition in the direction of the film thickness, which is made by heat treatment of metallic film 704 of Zr deposited on base thermal oxidation film (silicon oxidation film) under oxygen atmosphere to make plural kinds of gate insulator films with different electric film thickness. In addition, in the semiconductor device of the embodiment 5 the detailed element structure of each transistor, such as side walls pertaining to the gate electrode 710, which is used to form LDD structure are omitted in the drawing for the purpose to simplify the explanation.

Figure 7A:
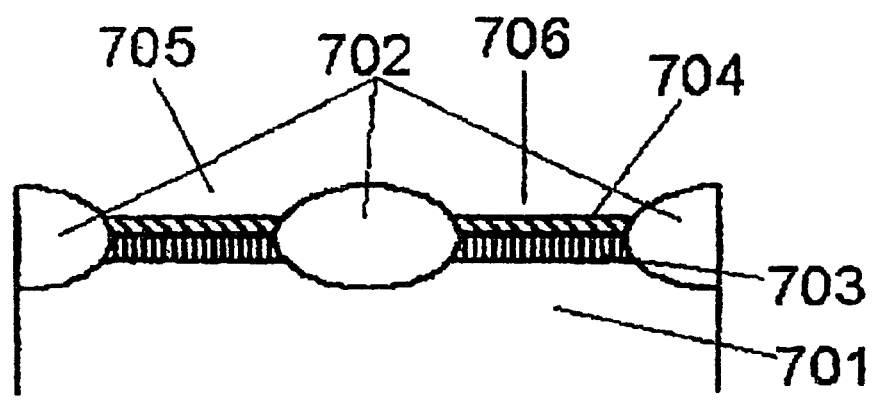
FIGS. 7A to 7E are partial longitudinal sectional views showing a series of process for manufacturing a semiconductor device of the fifth embodiment by means of multi-oxide process including a selective etching step to film structure of film of $Zro_2$ (film of ZrSio) modulated in composition in the direction of the film thickness in application of a method for manufacturing semiconductor device of the present invention.

FIG. 7A shows a region divided by the oxidation film 702 for element separation as the first region 705 and the second region 706 to form two kinds of transistors provided on the surface of the silicon substrate 701. Firstly, after cleaning the silicon substrate, the thermal oxidation film (silicon oxidation film) 703 with the film thickness of 1.0 nm is formed on the surface of the first region 705 and the second region 706.

On the surface of this silicon oxidation film 703 a metallic film 704 of Zr with the film thickness of 3 nm is deposited by vacuum deposition process on the condition that the substrate temperature is room temperature.

Figure 7B:
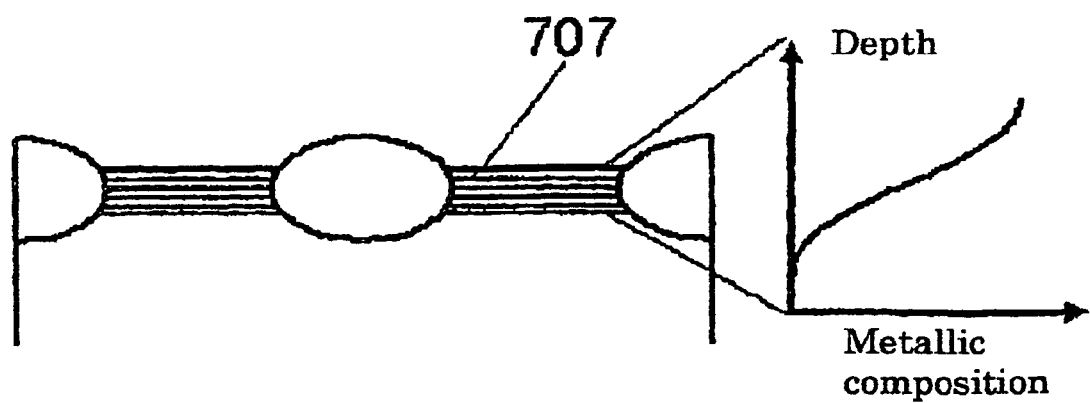

FIG. 7B shows exemplarily lamination structure of ZrO$_2$ (ZrSiO)/SiO$_2$ formed by heat treatment under the above oxidation atmosphere and change of the content rate (modulation in composition) of metallic element Zr in the lamination structure. After depositing the metallic film 704 of Zr, through oxidation treatment to the metallic film of Zr by subjecting to re-heat treatment at 600° C. under depressed oxygen atmosphere at 1 Torr the metallic film 704 of Zr is converted to the film 707 of ZrO$_2$(ZrSiO) modulated in composition in the direction of the film thickness. Specifically, in the interface with the silicon substrate 701 thickness of the film of SiO$_2$ increases by progression of oxidation reaction, and at the same time in the upper surface of silicon oxidation film 703 and the interface of ZrO$_2$/SiO$_2$, silicification of ZrO$_2$ to be generated occurs. In the event lamination structure of ZrO$_2$(ZrSiO)/SiO$_2$ is formed. The film of ZrO$_2$ generated by thermal oxidation treatment to this metallic film of Zr is amorphous. Etching rate of this film of ZrO$_2$ by diluting hydrofluoric acid solution is about one hundred times than that of the film of SiO$_2$ generated at the interface with the silicon substrate. In addition in the film 707 of ZrO$_2$(ZrSiO) modulated in composition in the direction of the film thickness, composition from ZrO$_2$ on the surface to silicate of ZrSiO at the neighborhood of interface with the film in the underneath layer of SiO$_2$ changes continuously and etching rate reduces continuously.

Figure 7C:
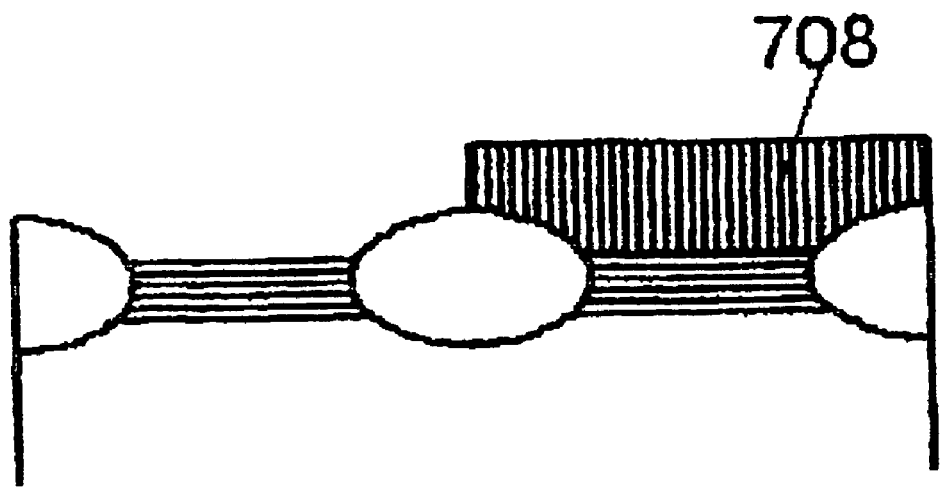

FIG. 7C shows a resist mask 708 utilized when subjecting only the film 707 of ZrO$_2$(ZrSiO) on the first region 705 to the process of selective etching and removing. The resist mask 708 protects the surface of the second region 706 and has an opening portion on the first region 705. Etching to the film 707 of $ZrO_2(ZrSiO)$ modulated in composition is carried out by diluting hydrofluoric acid solution while utilizing this resist mask 708. As mentioned above, in the film 707 of $ZrO_2(ZrSiO)$ modulated in composition in the direction of the film thickness, composition from $ZrO_2$ on the surface to silicate of ZrSiO at the neighborhood of interface with the film in the underneath layer of $SiO_2$ changes continuously and etching rate reduces continuously. But, by controlling the etching time such that the target etching quantity necessary for removal of the film of $ZrO_2(ZrSiO)$ is carried out, and the over-etching time does not lengthen unnecessarily, etching quantity to the exposed film of $SiO_2$, more specifically the film 709 of $SiO_2$ having a layer region of $SiO_2$ which surface includes minute amount of Zr, can be suppressed to the extent of negligible small, thereby enabling the good selective etching.

Figure 7D:
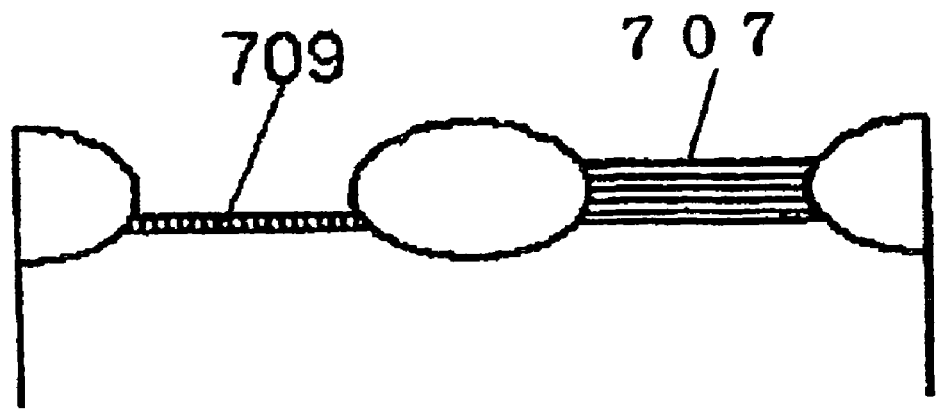

FIG. 7D shows a state wherein the resist mask 708 has been stripped off and removed after finishing the selective etching process to the first region 705. In doing so there is formed in the first region 705 a gate insulator film constituted of the film 709 of $SiO_2(ZrSiO)/SiO_2$ including Zr which continuously changes in composition and also there is formed in the second region 706 a gate insulator film constituted of lamination structure of $ZrO_2(ZrSiO)/SiO_2$ modulated in composition in the direction of the film thickness, respectively. Namely, even though the gate insulator film in the first region 705 is the composition of $SiO_2$ at the interface with the silicon substrate an insulating film existing thereon can be utilized as the high-dielectric insulating material by containing Zr.

Figure 7E:
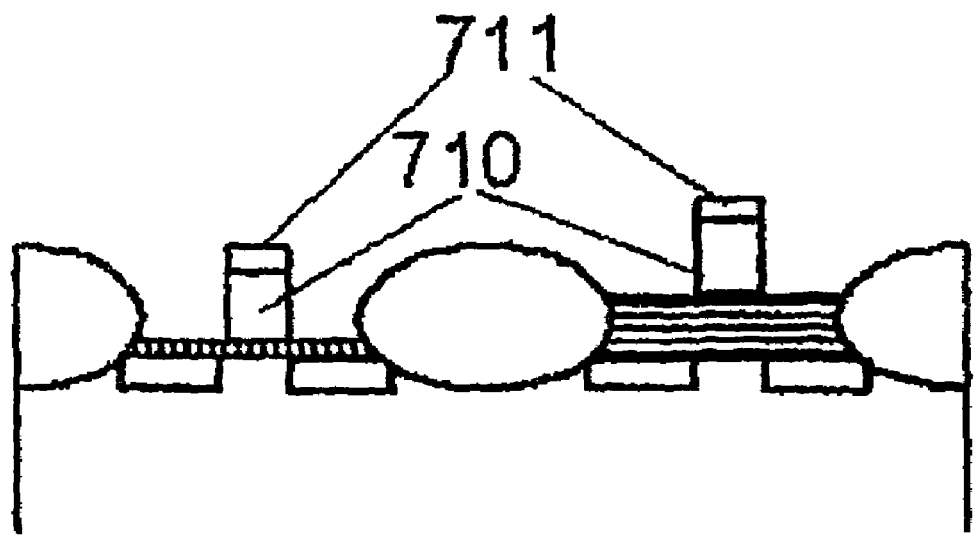

FIG. 7E shows a state of a transistor formed thereafter in accordance with the conventional process in which forming of source and drain is carried out by ion implantation while utilizing the polysilicon gate electrode 710 and the pertaining side wall. Also, there remains silicide layer 711 used in such process on the polysilicon gate electrode 710.

Also, as to the gate insulator film constituted of these films of high-dielectric insulating material with different film thickness in the first region and the second region of the embodiment 5, the uniformity in film thickness of gate insulator film in the same substrate and the electric property are improved as in the above embodiment 1, because composition of Zr in the gate insulator film reduces in accordance with approaching to the silicon substrate and becomes composition of $SiO_2$ at the neighborhood of the interface.

(Modification)

In the above described embodiments some examples utilizing thin films of $ZrO_2$ or ZrSiO as the high-dielectric insulating material are illustrated. However, the tendency with respect to difference of etching rate pertaining to difference of the film property as illustrated in FIG. 2 is also applicable to a great deal of high-dielectric insulating material which is candidate material for the gate insulator film. Therefore, though thermal stability or etching property to hydrofluoric acid solution of each thin film of the high-dielectric insulating material depends on the constitutive metallic element, it is possible to utilize multi-oxide process employing the selective etching process which utilizes difference of etching rate arising from difference of crystal structure or composition (including addition of different kinds of element).

Also, with respect to etching method it is preferable to utilize wet-etching process from the standpoint of damage by processing. But, dry-etching process can be employed. In case of utilizing dry-etching process, difference of etching rate arising from difference of crystal structure or composition (including addition of different kinds of element) is not noticeable in a dry-etching process based on physical sputtering mechanism by accelerated ion irradiation, and thus it is impossible to expect the selective etching. Accordingly, it is preferable to utilize a dry-etching process which excludes high energy component contributing to such a sputtering mechanism. More specifically, it is effective to utilize not sputtering mechanism, but reactive dry-etching process which utilizes reaction with fluorine radical bled off gas plasma of CF system by high frequency discharge.

On the other hand, though in the above described embodiment 2, the lamination structure of the high-dielectric insulating material film with the different crystal structure (amorphous/crystal) is formed by controlling film forming process and the substrate temperature even the same amorphous material can be amorphous material different in film density or dangling density in the film by changing the substrate temperature in film forming and the lamination structure of the thin film can be formed.

Figure 8:
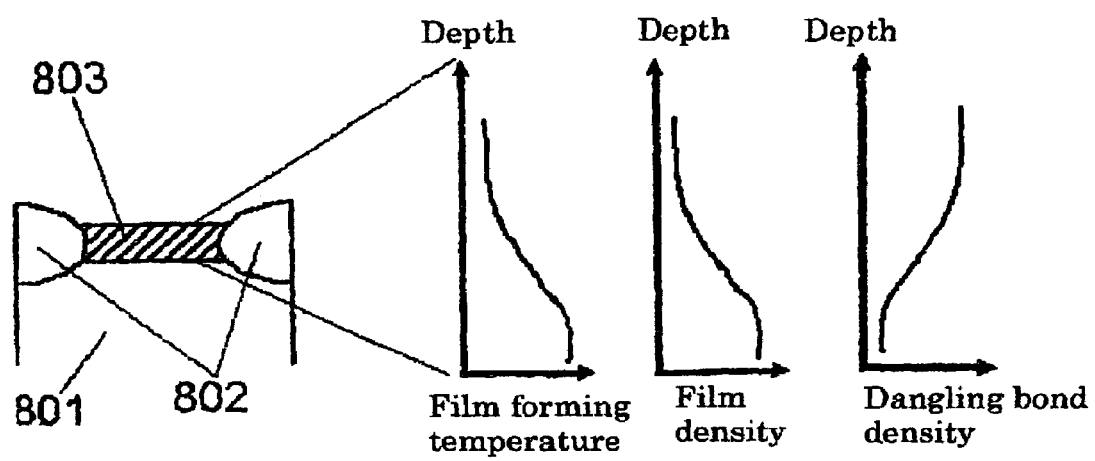
FIG. 8 is a view exemplarily showing, when forming a film of high-dielectric insulating material, typical variation of film density of the film of the high-dielectric insulating material arising from change of substrate temperature to depth of the film of the high-dielectric insulating material and typical variation of dangling bond density in the film of the high-dielectric insulating material.

For instance, FIG. 8 illustrates exemplarily relationships between the substrate temperature at sputter deposition, and film density and dangling density with respect to thin films of $ZrO_2$ deposited by sputtering process wherein the obtained film density of the deposition film sample becomes gradually low and the dangling bond density becomes high as the substrate temperature at sputter deposition becomes low. According to research for etching rate to hydrofluoric acid solution with respect to amorphous films of $Zro_2$ which are different in film density and dangling bond density it is figured out that the etching rate becomes large or fast, as the film density becomes low, correspondingly the dangling bond density becomes large or high. Namely, the amorphous film of $ZrO_2$ on the condition that the substrate temperature at sputter deposition is relatively low becomes large in etching rate by hydrofluoric acid solution. In case of forming the amorphous film of $ZrO_2$ by sputtering process while utilizing etching rate difference it is possible to realize multi-oxide process utilizing selective etching process as the same with the above embodiment 1 by laminating the film of $ZrO_2$ deposited on the condition of lowering film forming temperature on the film of $ZrO_2$ deposited at high temperature.

INDUSTRIAL APPLICABILITY

A semiconductor device of the present invention is provided that in a semiconductor device utilizing plural kinds of transistors having gate insulator films with different electric film thickness, at least two transistors in the semiconductor device are formed on the same silicon substrate and formed so as to have gate insulator films with different electric film thickness each other, and the one transistor including at least a first insulating film constituted of first high-dielectric insulating material in the gate insulator film and the other transistor having lamination structure including a second insulating film constituted of second high-dielectric insulating material in addition to the first insulating film constituted of the first high-dielectric insulating material in the gate insulator film, both gate insulator films can be constituted so as to be different from each other in the target electric film thickness by appropriately selecting the dielectric constant and film thickness of the first high-dielectric insulating material and the second high-dielectric insulating material.

Further, a method for manufacturing the semiconductor device of the present invention is provided that by employment of such element constitution, subsequent process can be performed without exposing the silicon substrate surface beneath the gate insulator film after forming the first insulating film constituted of the first high-dielectric insulating material, thereby effecting suppression of wafer contamination in multi-oxide process. For instance the lamination structure including a plurality of insulating films constituted of high-dielectric insulating material utilized in multi-oxide process is constituted by laminating thin films of plural kinds of high-dielectric insulating material different in constitution element, composition or crystal structure. Further because of including process for selectively etching and removing each thin film of high-dielectric insulating material while utilizing etching rate difference, the process can be easy to use and as the result, a multi-oxide process superior in repeatability can be accomplished. According to the method for manufacturing the semiconductor device of the present invention, by avoiding contamination of silicon substrate surface beneath the gate insulator film it is possible to prevent the electrical property of the gate insulator film from deteriorating and at the same time to suppress unnecessary over-etching quantity in the selective etching process and to form the gate insulator film superior in uniformity of film thickness in the substrate surface. In addition with respect to combination of plural kinds of thin films of high-dielectric insulating material with lamination structure, it is possible to optimize the constitution of the gate insulator film contributing to reduction of leak current.

What is claimed is:

1. A semiconductor device including plural kinds of transistors, the plural kinds of transistors including at least:
   a first transistor provided with a first gate insulator film which includes a first insulating film constituted of first high-dielectric insulating material and has first electric film thickness and
   a second transistor provided with a second gate insulator film which includes layer structure including the first insulating film and a second insulating film constituted of second high-dielectric insulating material different from the first high-dielectric insulating material and has second electric film thickness different from the first electric film thickness,
   the first and the second transistors being formed on the same silicon substrate.

2. The semiconductor device according to claim 1, wherein the first and the second high-dielectric insulating material include elements with different constitution each other.

3. The semiconductor device according to claim 1, wherein the first and the second high-dielectric insulating material include elements with the same constitution and different ratio of composition each other.

4. The semiconductor device according to claim 1, wherein the first and the second high-dielectric insulating material have different crystal structure each other.

5. The semiconductor device according to claim 1, wherein at least one of the first and the second insulating films continuously changes in the direction of film thickness in at least any one of kinds of constitutive element and ratio of composition.

6. The semiconductor device according to claim 1, wherein the first and the second high-dielectric insulating material have different density each other.

7. The semiconductor device according to claim 1, wherein the first and the second insulating films have different profiles each other with respect to density of dangling bond in the films in the direction of the film thickness.

8. The semiconductor device according to claim 1, wherein an interface layer constituted of at least any one of a silicon oxidation film, a silicon oxynitride film or a silicon nitriding film exists on interface between the first insulating film or the second insulating film, and relevant silicon substrate in at least one of the first and the second gate insulator films.

9. The semiconductor device according to claim 1, wherein the first and the second high-dielectric insulating material included in the second gate insulator film are different from each other in etching rate for wet-etching, and an insulating film constituted of insulating material with relatively high etching rate is extending on an insulating film constituted of insulating material with relatively low etching rate.

10. The semiconductor device according to claim 9, wherein the etching rate is the etching rate for hydrofluoric acid solution.

11. The semiconductor device according to claim 1, wherein the first and the second high-dielectric insulating material included in the second gate insulator film are different from each other in etching rate for vapor phase etching, and an insulating film constituted of insulating material with relatively high etching rate is extending on an insulating film constituted of insulating material with relatively low etching rate.

12. The semiconductor device according to claim 11, wherein the etching rate is the etching rate for vapor phase etching by fluorine radical.

13. The semiconductor device according to claim 1, wherein the layer structure including the first insulating film and the second insulating film comprises a layer modulated in composition in the direction of film thickness, underneath region of the layer being formed with a first insulating film constituted of the first high-dielectric insulating material and upper region of the layer being formed with a second insulating film constituted of the second high-dielectric insulating material.

14. The semiconductor device constituted of at least;
   first insulating film structure which includes a first insulating film constituted of first high-dielectric insulating material and has first electric film thickness and
   second insulating filmstructure which includes layer structure including the first insulating film and a second insulating film constituted of second high-dielectric insulating material different from the first high-dielectric insulating material and has second electric film thickness different from the first electric film thickness,
   the first and the second insulating film structure being formed on the same semiconductor substrate.

15. The semiconductor device according to claim 14, wherein the first and the second high-dielectric insulating material include elements with different constitution each other.

16. The semiconductor device according to claim 14, wherein the first and the second high-dielectric insulating material include elements with the same constitution and different ratio of composition each other.

17. The semiconductor device according to claim 14, wherein the first and the second high-dielectric insulating material have different crystal structure each other.

18. The semiconductor device according to claim 14, wherein at least one of the first and the second insulating films continuously changes in the direction of the film thickness in at least any one of kinds of constitutive element and ratio of composition.

19. The semiconductor device according to claim 14, wherein the first and the second high-dielectric insulating material have different density each other.

20. The semiconductor device according to claim 14, wherein the first and the second insulating films have different profiles each other with respect to density of dangling bond in the films in the direction of film thickness.

21. The semiconductor device according to claim 14, wherein the semiconductor substrate is constituted of silicon substrate, and an interface layer constituted of at least any one of a silicon oxidation film, a silicon oxynitride film or a silicon nitriding film exists on interface between the first insulating film or the second insulating film, and relevant silicon substrate in at least one of the first and the second gate insulator films.

22. The semiconductor device according to claim 14, wherein the first and the second high-dielectric insulating material included in the second insulating film structure are different from each other in etching rate for wet-etching, and an insulating film constituted of insulating material with relatively high etching rate is extending on an insulating film constituted of insulating material with relatively low etching rate.

23. The semiconductor device according to claim 22, wherein the etching rate is the etching rate for hydrofluoric acid solution.

24. The semiconductor device according to claim 14, wherein the first and the second high-dielectric insulating material included in the second insulating film structure are different from each other in etching rate for vapor phase etching, and an insulating film constituted of insulating material with relatively high etching rate is extending on an insulating film constituted of insulating material with relatively low etching rate.

25. The semiconductor device according to claim 24, wherein the etching rate is the etching rate for vapor phase etching by fluorine radical.

26. The semiconductor device according to claim 14, wherein the first and the second insulating film structure are included in different kinds of first and second semiconductor elements which are formed on the same semiconductor substrate and contact with the semiconductor substrate surface.

27. The semiconductor device according to claim 26, wherein the first and the second semiconductor elements are of the type of field effect transistor, and the first and the second insulating film structure are provided for electrically separating an electrode for controlling electric field from the semiconductor substrate surface.

28. The semiconductor device according to claim 14, wherein the layer structure including the first insulating film and the second insulating film comprises a layer modulated in composition in the direction of film thickness, underneath region of the layer being formed with a first insulating film constituted of the first high-dielectric insulating material and upper region of the layer being formed with a second insulating film constituted of the second high-dielectric insulating material.

29. A semiconductor device including plural kinds of semiconductor elements, the plural kinds of semiconductor elements including at least:
a first semiconductor element provided with first insulating film structure which includes a first insulating film constituted of first high-dielectric insulating material with first etching rate and has first electric film thickness and
a second semiconductor element provided with a second insulating film structure which includes layer structure including the first insulating film and a second insulating film constituted of second high-dielectric insulating material with second etching rate different from the first etching rate, and which has second electric film thickness different from the first electric film thickness,
the first and the second semiconductor elements being formed on the same silicon substrate surface.

30. The semiconductor device according to claim 29, wherein the first and the second high-dielectric insulating material include elements with different constitution each other.

31. The semiconductor device according to claim 29, wherein the first and the second high-dielectric insulating material include elements with the same constitution and different ratio of composition each other.

32. The semiconductor device according to claim 29, wherein the first and the second high-dielectric insulating material have different crystal structure each other.

33. The semiconductor device according to claim 29, wherein at least one of the first and second insulating films continuously changes in the direction of the film thickness in at least any one of kinds of constitutive element and ratio of composition.

34. The semiconductor device according to claim 29, wherein the first and the second high-dielectric insulating material have different density each other.

35. The semiconductor device according to claim 29, wherein the first and the second insulating films have different profiles each other with respect to density of dangling bond in the films in the direction of film thickness.

36. The semiconductor device according to claim 29, wherein an interface layer constituted of at least any one of a silicon oxidation film, a silicon oxynitride film or a silicon nitriding film exists on interface between the first insulating film or the second insulating film, and relevant silicon substrate in at least one of the first and the second gate insulator films.

37. The semiconductor device according to claim 29, wherein the first and the second high-dielectric insulating material included in the second gate insulator film are different from each other in etching rate for wet-etching, and an insulating film constituted of insulating material with relatively high etching rate is extending on an insulating film constituted of insulating material with relatively low etching rate.

38. The semiconductor device according to claim 37, wherein the etching rate is the etching rate for hydrofluoric acid solution.

39. The semiconductor device according to claim 29, wherein the first and the second high-dielectric insulating material included in the second insulating film structure are different from each other in etching rate for vapor phase etching, and an insulating film constituted of insulating material with relatively high etching rate is extending on an insulating film constituted of insulating material with relatively low etching rate.

40. The semiconductor device according to claim 39, wherein the etching rate is the etching rate for vapor phase etching by fluorine radical.

41. The semiconductor device according to claim 29, wherein the layer structure including the first insulating film and the second insulating films comprises a layer modulated in composition in the direction of film thickness, underneath region of the layer being formed with a first insulating film constituted of the first high-dielectric insulating material and upper region of the layer being formed with a second insulating film constituted of the second high-dielectric insulating material.

42. A method for manufacturing a semiconductor device including plural kinds of transistors, wherein at least two kinds of transistors included in the plural kinds of transistors are formed on the same silicon substrate and have gate insulator films in which electric film thickness are different each other, and
wherein the semiconductor device includes, as the two kinds of transistors, a first transistor provided with a first gate insulator film including partially therein a first insulating film constituted of at least first high-dielectric insulating material, and a second transistor provided with a second gate insulator film including partially therein laminate structure of a first insulating film constituted of at least the first high-dielectric insulating material and a second insulating film constituted of second high-dielectric insulating material,
the method constituted of;
a step for forming the first and second gate insulator films and the step at least including
a step for forming layer structure including a first insulating film constituted of the first high-dielectric insulating material and a second insulating film constituted of the second high-dielectric insulating material and extending on the first insulating film, in a first forming region for forming the first transistor and in a second forming region for forming the second transistor, both regions being selected on the same silicon substrate, and
a step for selectively removing the second insulating film while remaining the first insulating film at least in the first forming region.

43. The method for manufacturing a semiconductor device according to claim 42, wherein, in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material.

44. The method for manufacturing a semiconductor device according to claim 43, wherein the etching solution is hydrofluoric acid solution.

45. The method for manufacturing a semiconductor device according to claim 42, wherein, in the step for selectively removing the second insulating film, the second insulating film is selectively etched and removed by vapor phase etching process utilizing fluorine radical in which difference of etching rate exists between etching rate to the second high-dielectric insulating material and etching rate to the first high-dielectric insulating material.

46. The method for manufacturing a semiconductor device according to claim 42, wherein the method further includes a step for forming a base insulating film constituted of at least any one of a silicon oxidation film, a silicon oxynitride film and a silicon nitriding film in the first and second forming regions, thereby forming the first insulating film on the base insulating film.

47. The method for manufacturing a semiconductor device according to claim 46, wherein, in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material or the base insulating film.

48. The method for manufacturing a semiconductor device according to claim 47, wherein the etching solution is hydrofluoric acid solution.

49. The method for manufacturing a semiconductor device according to claim 46, wherein, in the step for selectively removing the second insulating film, the second insulating film is selectively etched and removed by vapor phase etching process utilizing fluorine radical in which difference of etching rate exists between etching rate to the second high-dielectric insulating material and etching rate to the first high-dielectric insulating material or the base insulating film.

50. The method for manufacturing a semiconductor device according to claim 42, wherein, the first and the second high-dielectric insulating material are formed to have different crystal structure each other by setting such that first temperature of the substrate when forming the first insulating film and second temperature of the substrate when forming the second insulating film are different from each other.

51. The method for manufacturing a semiconductor device according to claim 42, wherein the method further includes a step for subjecting the first and the second insulating films to heat treatment after carrying out a step of forming the second insulating film, temperature of the heat treatment being set such that at least one of the first and the second high-dielectric insulating material is improved on its property.

52. The method for manufacturing a semiconductor device according to claim 42, wherein the step for forming the first and the second insulating films comprises
a step for forming the first insulating film constituted of the first high-dielectric insulating material in the first and the second forming regions and
a step for forming the second insulating film constituted of the second high-dielectric insulating material on the first insulating film.

53. The method for manufacturing a semiconductor device according to claim 42, wherein the step for forming the first and the second insulating films comprises
a step for forming the first insulating film constituted of the first high-dielectric insulating material in the first and second forming regions,
a step for forming metal film on the first insulating film,
a step for forming composition-modulated layers by subjecting the first insulating film and the metal film to heat treatment,
the heat treatment causing that a reaction occurs between constitutive element of the first insulating film and constitutive element of the metal film, a laminated body of the first insulating film and the metal film is composition-modulated in the direction of the film thickness, underneath region is constituted of the first insulating film constituted of the first high-dielectric insulating material, and upper region is constituted of the second insulating film constituted of the second high-dielectric insulating material.

54. A method for forming first and second insulating film structure with different electric film thickness each other on the same semiconductor substrate, the method including;
a step for forming layer structure including a first insulating film constituted of first high-dielectric insulating material and a second insulating film constituted of second high-dielectric insulating material extending on the first insulating film in a first selection region and a second selection region selected on the semiconductor substrate and a step for selectively removing the second insulating film while remaining the first insulating film at least in the first selection region.

55. The method according to claim 54, wherein, in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material.

56. The method according to claim 55, wherein the etching solution is hydrofluoric acid solution.

57. The method according to claim 54, wherein, in the step for selectively removing the second insulating film, the second insulating film is selectively etched and removed by vapor phase etching process utilizing fluorine radical in which difference of etching rate exists between etching rate to the second high-dielectric insulating material and etching rate to the first high-dielectric insulating material.

58. The method according to claim 54, wherein the method further includes a step for forming a base insulating film constituted of at least any one of a silicon oxidation film, a silicon oxynitride film and a silicon nitriding film in the first and the second forming regions, thereby forming the first insulating film on the base insulating film.

59. The method according to claim 58, wherein, in the step for selectively removing the second insulating film, the second insulating film is selectively etched and removed by wet-etching process utilizing etching solution with solution composition in which difference of etching rate exists between etching rate to the second high-dielectric insulating material and etching rate to the first high-dielectric insulating material or the base insulating film.

60. The method according to claim 59, wherein the etching solution is hydrofluoric acid solution.

61. The method according to claim 58, wherein, in the step for selectively removing the second insulating film, the second insulating film is selectively etched and removed by vapor phase etching process utilizing fluorine radical with mid-level vapor phase density in which difference of etching rate exists between etching rate to the second high-dielectric insulating material and etching rate to the first high-dielectric insulating material or the base insulating film.

62. The method according to claim 54, wherein the first and the second high-dielectric insulating material are formed to have different crystal structure each other by setting such that first temperature of the substrate when forming the first insulating film and second temperature of the substrate when forming the second insulating film are different from each other.

63. The method according to claim 54, wherein the method further includes a step for subjecting the first and the second insulating films to heat treatment after carrying out a step of forming the second insulating film, temperature of the heat treatment being set such that at least one of the first and the second high-dielectric insulating material is improved on its property.

64. The method for manufacturing a semiconductor device according to claim 54, wherein the step for forming the first and the second insulating films comprises a step for forming the first insulating film constituted of the first high-dielectric insulating material in the first and the second forming regions and a step for forming the second insulating film constituted of the second high-dielectric insulating material on the first insulating film.

65. The method according to claim 54, wherein the step for forming the first and the second insulating films comprises;

a step for forming the first insulating film constituted of the first high-dielectric insulating material in the first and second forming regions, a step for forming metal film on the first insulating film, a step for forming composition-modulated layers by subjecting the first insulating film and the metal film to heat treatment, the heat treatment causing that a reaction occurs between constitutive element of the first insulating film and constitutive element of the metal film, a laminated body of the first insulating film and the metal film is composition-modulated in the direction of the film thickness, underneath region is constituted of the first insulating film constituted of the first high-dielectric insulating material, and upper region is constituted of the second insulating film constituted of the second high-dielectric insulating material.

* * * * *